United States Patent
Aria et al.

(10) Patent No.: US 9,449,816 B2
(45) Date of Patent: *Sep. 20, 2016

(54) METHOD FOR PRODUCING GRAPHENE OXIDE WITH TUNABLE GAP

(71) Applicant: California Institute of Technology, Pasadena, CA (US)

(72) Inventors: Adrianus Indrat Aria, Pasadena, CA (US); Morteza Gharib, Altadena, CA (US); Adi Wijaya Gani, Stanford, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 75 days.

This patent is subject to a terminal disclaimer.

(21) Appl. No.: 14/095,454

(22) Filed: Dec. 3, 2013

(65) Prior Publication Data

US 2014/0094021 A1  Apr. 3, 2014

Related U.S. Application Data

(63) Continuation of application No. 13/316,771, filed on Dec. 12, 2011, now Pat. No. 8,609,458.

(60) Provisional application No. 61/422,092, filed on Dec. 10, 2010.

(51) Int. Cl.
| | |
|---|---|
| *H01L 51/40* | (2006.01) |
| *H01L 29/08* | (2006.01) |
| *H01L 21/02* | (2006.01) |
| *C01B 31/04* | (2006.01) |
| *B82Y 30/00* | (2011.01) |
| *B82Y 40/00* | (2011.01) |

(52) U.S. Cl.
CPC ......... *H01L 21/02527* (2013.01); *B82Y 30/00* (2013.01); *B82Y 40/00* (2013.01); *C01B 31/043* (2013.01); *C01B 31/0484* (2013.01); *H01L 21/02614* (2013.01)

(58) Field of Classification Search
None
See application file for complete search history.

(56) References Cited

U.S. PATENT DOCUMENTS

| | | | |
|---|---|---|---|
| 3,964,482 | A | 6/1976 | Gerstel et al. |
| 4,842,390 | A | 6/1989 | Sottini et al. |

(Continued)

FOREIGN PATENT DOCUMENTS

| | | |
|---|---|---|
| EP | 1948562 B1 | 7/2010 |
| JP | 2006-114265 | 4/2006 |

(Continued)

OTHER PUBLICATIONS

Yan et al., "Structural and Electronic Properties of Oxidized Graphene", Phys. Rev. Lett. 103, 086802 (2009).*

(Continued)

*Primary Examiner* — Matthew Landau
*Assistant Examiner* — Priya Rampersaud
(74) *Attorney, Agent, or Firm* — One LLP

(57) ABSTRACT

A method of fabricating a graphene oxide material in which oxidation is confined within the graphene layer and that possesses a desired band gap is provided. The method allows specific band gap values to be developed. Additionally, the use of masks is consistent with the method, so intricate configurations can be achieved. The resulting graphene oxide material is thus completely customizable and can be adapted to a plethora of useful engineering applications.

21 Claims, 12 Drawing Sheets

(56) References Cited

U.S. PATENT DOCUMENTS

| | | |
|---|---|---|
| 5,116,317 A | 5/1992 | Carson, Jr. et al. |
| 5,457,041 A | 10/1995 | Ginaven et al. |
| 6,256,533 B1 | 7/2001 | Yuzhakov et al. |
| 6,334,856 B1 | 1/2002 | Allen et al. |
| 6,379,324 B1 | 4/2002 | Gartstein et al. |
| 6,471,903 B2 | 10/2002 | Sherman et al. |
| 6,503,231 B1 | 1/2003 | Prausnitz et al. |
| 6,533,949 B1 | 3/2003 | Yeshurun et al. |
| 6,720,547 B1 | 4/2004 | Rajadhyaksha et al. |
| 6,749,792 B2 | 6/2004 | Olson |
| 6,866,801 B1 | 3/2005 | Mau et al. |
| 6,924,335 B2 | 8/2005 | Fan et al. |
| 7,037,562 B2 | 5/2006 | Jimenez |
| 7,097,776 B2 | 8/2006 | Govinda Raju |
| 7,160,620 B2 | 1/2007 | Huang et al. |
| 7,183,003 B2 | 2/2007 | Leu et al. |
| 7,235,442 B2 | 6/2007 | Wang et al. |
| 7,291,396 B2 | 11/2007 | Huang et al. |
| 7,393,428 B2 | 7/2008 | Huang et al. |
| 7,396,477 B2 | 7/2008 | Hsiao |
| 7,438,844 B2 | 10/2008 | Huang et al. |
| 7,491,628 B2 | 2/2009 | Noca et al. |
| 7,534,648 B2 | 5/2009 | Raravikar et al. |
| 7,569,425 B2 | 8/2009 | Huang et al. |
| 7,611,628 B1 | 11/2009 | Hinds, III |
| 7,611,651 B2 | 11/2009 | Huang et al. |
| 7,695,769 B2 | 4/2010 | Watanabe et al. |
| 7,955,644 B2 | 6/2011 | Sansom et al. |
| 8,043,250 B2 | 10/2011 | Xu |
| 8,048,017 B2 | 11/2011 | Xu |
| 8,062,573 B2 | 11/2011 | Kwon |
| 8,257,324 B2 | 9/2012 | Prausnitz et al. |
| 8,377,590 B2 | 2/2013 | Park et al. |
| 8,976,507 B2 | 3/2015 | Aria et al. |
| 2001/0023986 A1 | 9/2001 | Mancevski |
| 2002/0155737 A1 | 10/2002 | Roy et al. |
| 2003/0069548 A1 | 4/2003 | Connelly et al. |
| 2003/0119920 A1 | 6/2003 | Wang et al. |
| 2003/0180472 A1 | 9/2003 | Zhou et al. |
| 2005/0011858 A1 | 1/2005 | Kuo et al. |
| 2005/0029223 A1 | 2/2005 | Yeshurun et al. |
| 2005/0067346 A1 | 3/2005 | Noack et al. |
| 2005/0100960 A1 | 5/2005 | Dai et al. |
| 2005/0127351 A1 | 6/2005 | Tolt |
| 2005/0157386 A1 | 7/2005 | Greenwald et al. |
| 2005/0167647 A1 | 8/2005 | Huang et al. |
| 2005/0171480 A1 | 8/2005 | Mukerjee et al. |
| 2005/0220674 A1 | 10/2005 | Shafirstein et al. |
| 2005/0230082 A1 | 10/2005 | Chen |
| 2005/0245659 A1 | 11/2005 | Chen |
| 2006/0030812 A1 | 2/2006 | Golubovic-Liakopoulos et al. |
| 2006/0057388 A1 | 3/2006 | Jin et al. |
| 2006/0073712 A1 | 4/2006 | Suhir |
| 2006/0084942 A1 | 4/2006 | Kim et al. |
| 2006/0093642 A1 | 5/2006 | Ranade |
| 2006/0118791 A1 | 6/2006 | Leu et al. |
| 2006/0184092 A1 | 8/2006 | Atanasoska et al. |
| 2006/0184112 A1 | 8/2006 | Horn et al. |
| 2006/0226016 A1 | 10/2006 | S/O Govinda Raju et al. |
| 2006/0231970 A1 | 10/2006 | Huang et al. |
| 2006/0286305 A1 | 12/2006 | Thies et al. |
| 2007/0053057 A1 | 3/2007 | Zust et al. |
| 2007/0066934 A1 | 3/2007 | Etheredge et al. |
| 2007/0066943 A1 | 3/2007 | Prasad et al. |
| 2007/0081242 A1 | 4/2007 | Kempa et al. |
| 2007/0099311 A1 | 5/2007 | Zhou et al. |
| 2007/0114658 A1 | 5/2007 | Dangelo et al. |
| 2007/0187694 A1 | 8/2007 | Pfeiffer |
| 2007/0207182 A1 | 9/2007 | Weber et al. |
| 2007/0244245 A1 | 10/2007 | Liu et al. |
| 2007/0276330 A1 | 11/2007 | Beck et al. |
| 2008/0009800 A1 | 1/2008 | Nickel |
| 2008/0199626 A1 | 8/2008 | Zhou et al. |
| 2008/0269666 A1 | 10/2008 | Wang et al. |
| 2008/0292840 A1 | 11/2008 | Majumdar et al. |
| 2008/0318049 A1 | 12/2008 | Hata et al. |
| 2009/0032496 A1 | 2/2009 | Yao et al. |
| 2009/0068387 A1 | 3/2009 | Panzer et al. |
| 2009/0118662 A1 | 5/2009 | Schnall |
| 2009/0130370 A1 | 5/2009 | Sansom et al. |
| 2009/0140801 A1 | 6/2009 | Ozyilmaz et al. |
| 2009/0208743 A1 | 8/2009 | Pettit |
| 2009/0269560 A1 | 10/2009 | Dhinojwala et al. |
| 2010/0075024 A1 | 3/2010 | Ajayan et al. |
| 2010/0132773 A1 | 6/2010 | Lagally et al. |
| 2010/0178464 A1 | 7/2010 | Choi et al. |
| 2010/0196446 A1 | 8/2010 | Gharib et al. |
| 2010/0247777 A1 | 9/2010 | Nikolaev et al. |
| 2010/0253375 A1 | 10/2010 | Fang et al. |
| 2010/0330277 A1 | 12/2010 | Ajayaghosh et al. |
| 2011/0045080 A1 | 2/2011 | Powis et al. |
| 2011/0068290 A1 | 3/2011 | Haddon et al. |
| 2011/0233779 A1 | 9/2011 | Wada et al. |
| 2011/0250376 A1 | 10/2011 | Aria et al. |
| 2012/0021164 A1 | 1/2012 | Sansom et al. |
| 2012/0058170 A1 | 3/2012 | Gharib et al. |
| 2012/0129736 A1* | 5/2012 | Tour ............ B82Y 30/00 507/140 |
| 2012/0184065 A1 | 7/2012 | Gharib et al. |
| 2013/0178722 A1 | 7/2013 | Aria et al. |

FOREIGN PATENT DOCUMENTS

| | | |
|---|---|---|
| JP | 2006-164835 | 6/2006 |
| TW | 253 898 | 4/2006 |
| TW | 256 877 | 6/2006 |
| WO | 96/21938 A1 | 7/1996 |
| WO | 2006/041535 A1 | 4/2006 |
| WO | PCT/US2008/012641 | 12/2009 |
| WO | PCT/US2007/015754 | 1/2010 |
| WO | PCT/US2007/015754 | 2/2010 |
| WO | PCT/US2008/012641 | 5/2010 |
| WO | 2010/087971 A2 | 8/2010 |
| WO | 2010/120564 A2 | 10/2010 |
| WO | PCT/US2010/000243 | 11/2010 |
| WO | PCT/US2010/000243 | 8/2011 |
| WO | PCT/US2011/031465 | 12/2011 |
| WO | 2012079066 A2 | 6/2012 |
| WO | 2012079066 A3 | 6/2012 |
| WO | PCT/US2012/069941 | 2/2013 |
| WO | 2013/090844 A1 | 6/2013 |
| WO | PCT/US2013/052580 | 10/2013 |
| WO | PCT/US2012/069941 | 6/2014 |
| WO | PCT/US2013/052580 | 2/2015 |

OTHER PUBLICATIONS

Ito et al., "Semiconducting nature of the oxygen-adsorbed graphene sheet" J. Appl. Phys. 103, 113712 (2008).*

International Search Report and Written Opinion for International Application PCT/US2011/064338, International Filing Date Dec. 12, 2011, Search Completed Jul. 31, 2012, Mailed Jul. 31, 2012, 7pgs.

Leconte et al., "Damaging Graphene with Ozone Treatment: A Chemically Tunable Metal-Insulator Transition", ACS Nano, 2010, pp. 4033-4038.

Cai et al., "Synthesis and Solid-State NMR Structural Characterization of 13C-Labeled Graphite Oxide", Science, 2008, vol. 321, pp. 1815-1817.

Cheng et al., "Oxidation of graphene in ozone under ultraviolet light", 2008, Applied Physics Letters 2012, 101, pp. 073110-1-073110-4.

Ito et al., "Semiconducting nature of the oxygen-adsorbed graphene sheet", J. Appl. Phys. 103, p. 113712.

Kim et al., "The structural and electrical evolution of graphene by oxygen plasma-induced disorder", 2009, Nanotechnology, vol. 20, p. 375703.

Li et al., "Oxygen-Driven Unzipping of Graphitic Materials", Physical Review Letters 2006, vol. 96, p. 176101.

Nourbakhsh et al., "Bandgap opening in oxygen plasma-treated graphene", Nanotechnology, 2010, vol. 21, 435203.

(56) References Cited

OTHER PUBLICATIONS

Schniepp et al., "Functionalized Single Graphene Sheets Derived from Splitting Graphite Oxide", Journal of Physical Chemistry B Letters, 2006, vol. 110, 2006, pp. 8535-8539.

Sun et al., "Mechanisms for Oxidative Unzipping and Cutting of Graphene", Nano Letters, 2011, 12, pp. 17-21.

Yan et al., "Structural and Electronic Properties of Oxidized Graphene", Phys. Rev. Lett., 2009, vol. 103, 086802.

Ajayan, P.M., et al., "Aligned Carbon Nanotube Arrays Formed by Cutting a Polymer Resin-Nanotube Composite", Science, vol. 265, No. 5176, Aug. 1994, pp. 1212-1214.

Anderson, A., et al., "High sensitivity assays for docetaxel and paclitaxel in plasma using solid-phase extraction and high-performance liquid chromatography with UV detection", BMC Clinical Pharmacology, Jan. 2006, vol. 6, Issue 2, pp. 1-10.

Arakawa, K., et al., "Fluorescence Analysis of Biochemical Constituents Identifies Atherosclerotic Plaque With a Thin Fibrous Cap", Arterioscler. Thromb. Vase. Biol., 2002, vol. 22, pp. 1002-1007.

Aria, A.I., et al., "Reversible Tuning of the Wettability of Carbon Nanotube Arrays: The Effect of Ultraviolet/Ozone and Vacuum Pyrolysis Treatments", Langmuir, 2011, vol. 27, pp. 9005-9011.

Arifin, D.Y., et al., "Role of Convective Flow in Carmustine Delivery to a Brain Tumor", Pharmaceutical Research, 2009, pp. 1-14.

Barber, A.H., et al., "Static and Dynamic Wetting Measurements of Single Carbon Nanotubes", Physical Review Letters, vol. 92, No. 18, May 2004, pp. 186103-1-186103-4.

Boldor, D., et al., "Temperature Measurement of Carbon Nanotubes Using Infrared Thermography", Chem. Matter., vol. 20, No. 12, 2008, pp. 4011-4016.

Boo, H., et al., "Electrochemical Nanoneedle Biosensor Based on Multiwall Carbon Nanotube", Anal. Chem., vol. 78, No. 2, 2006, pp. 617-620.

Borca-Tasciuc, T., et al., "Anisotropic Thermal Diffusivity Characterization of Aligned Carbon Nanotube-Polymer Composites", Journal of Nanoscience and Nanotechnology, vol. 7, No. 4, 2007, pp. 1581-1588.

Boyea, J.M. et al., "Carbon Nanotube-Based Supercapacitors: Technologies and Markets", Nanotechnology Law & Business, Mar. 2007, vol. 4, No. 1, pp. 585-593.

Bronikowski, M.J., "CVD growth of carbon nanotube bundle arrays", Carbon, 2006, vol. 44, pp. 2822-2832.

Bronikowski, M.J., "Longer Nanotubes at Lower Temperatures: The Influence of Effective Activation Energies on Carbon Nanotube Growth by Thermal Chemical Vapor Deposition", J. Phys. Chem. C, vol. 111, No. 48, 2007, pp. 17705-17712.

Celermajer, D.S., "Understanding the pathophysiology of the arterial wall: which method should we choose?", European Heart Journal Supplements, 2002, vol. 4, Supplement F, pp. F24-F28.

Chen, Chuan-Hua, et al., "Dropwise condensation on superhydrophobic surfaces with two-tier roughness", Appl. Phys. Ltrs., 2007, vol. 90, pp. 173108-1-173108-3.

Chen, J., et al., "Functionalized Single-Walled Carbon Nanotubes as Rationally Designed Vehicles for Tumor-Targeted Drug Delivery", J. Am. Chem. Soc., 2008, vol. 130, pp. 16778-16785.

Cheng, Li et al., "A fullerene-single wall carbon nanotube complex for polymer bulk heterojunction photovoltaic cells", J. Matter. Chem., 2007, vol. 17, pp. 2406-2411.

Choi, T.Y., et al., "Measurement of thermal conductivity of individual multiwalled carbon nanotubes by the 3-ω method", Appl. Phys. Letters, vol. 87, No. 1, 2005, pp. 013108-1013108-3.

Conway, B.E., "Electromechanical Supercapacitors: Scientific Fundamentals and Technological Applications", Chapter 2—Similarities and Differences between Supercapacitors and Batteries for Storing Electrical Energy, 1999, pp. 11-31.

Correa-Duarte, M.A., et al., "Fabrication and Biocompatibility of Carbon Nanotube-Based 3D Networks as Scaffolds for Cell Seeding and Growth", Nano Letters, 2004, vol. 4, No. 11, pp. 2233-2236.

Correa-Duarte, M.A., et al., "Nanoengineered Polymeric Thin Films by Sintering CNT-Coated Polystyrene Spheres", Small, vol. 2, No. 2, 2006, pp. 220-224.

Crabtree, G.W., et al., "Solar energy conversion", Physics Today, vol. 60, No. 3, 2007, pp. 37-42.

Creel, C.J., et al., "Arterial Paclitaxel Distribution and Deposition", Circ. Res., vol. 86, No. 8, 2000, pp. 879-884.

Cui, D., et al., "Effect of single wall carbon nanotubes on human HEK293 cells", Toxicology Letters, 2005, vol. 155, pp. 73-85.

Dai, L., et al., "Functionalized surfaces based on polymers and carbon nanotubes for some biomedical and optoelectronic applications", Nanotechnology, vol. 14, No. 10, 2003, pp. 1084-1097.

Daniello, R.J., et al., "Drag reduction in turbulent flows over superhydrophobic surfaces", Physics of Fluids, 2009, vol. 21, pp. 085103-1-085103-9.

Daraio, C., et al., "Highly nonlinear contact interaction and dynamic energy dissipation by forest of carbon nanotubes", Appl. Phys. Ltrs., vol. 85, No. 23, pp. 5724-5726.

Davies, M.J., "The Composition of Coronary-Artery Plaques", The New England Journal of Medicine, 1997, vol. 336, No. 18, pp. 1312-1314.

Davis, S. P., et al., "Insertion of microneedles into skin: measurement and prediction of insertion force and needle fracture force", Journal of Biomechanics, 2004, vol. 34, pp. 1155-1163.

Detter, C., et al., "Fluorescent Cardiac Imaging : A Novel Intraoperative Method for Quantitative Assessment of Myocardial Perfusion During Graded Coronary Artery Stenosis", Circulation, 2007, vol. 116, pp. 1007-1014.

Diaz, J.F., et al., "Macromolecular Accessibility of Fluorescent Taxoids Bound at a Paclitaxel Binding Site in the Microtubule Surface", J. Biol. Chem., 2005, vol. 280, No. 5, pp. 3928-3937.

Dresselhaus, M.S., et al., "The big picture of Raman scattering in carbon nanotubes", Vibrational Spectroscopy, 2007, vol. 45, No. 2, pp. 71-81.

Dresselhaus, M.S., et al., "Raman spectroscopy as a probe of graphene and carbon Nanotubes", Philosophical Transactions of the Royal Society, 2008, vol. 3666, pp. 231-236.

Elias, K.L., et al., "Enhanced functions of osteoblasts on nanometer diameter carbon fibers", Biomaterials, 2002, vol. 23, pp. 3279-3287.

Falvo, M.R., et al., "Bending and buckling of carbon nanotubes under large strain", Nature, vol. 389, 1997, pp. 582-584.

Fan, S., et al., "Self-Oriented Regular Arrays of Carbon Nanotubes and Their Field Emission Properties", Science, vol. 283, Jan. 1999, pp. 512-514.

Firkowska, I. et al., Highly Ordered MWNT-Based Matrixes: Topography at the Nanoscale Conceived for Tissue Engineering, Langmuir, vol. 22, 2006, pp. 5427-5434.

Frank, S., et al., "Carbon Nanotube Quantum Resistors", Science, vol. 280, 1998, pp. 1744-1746.

Futaba, D.N., et al., "Shape-engineerable and highly densely packed single-walled carbon nanotubes and their application as supercapacitor electrodes", Nature Materials, 2006, vol. 5, pp. 987-994.

Gabay, T., et al., Engineered self-organization of neural networks using carbon nanotube clusters Physica A, 2005, vol. 350, pp. 611-621.

Glazachev, Y.I., "Fluorescence Photobleaching Recovery Method with Pulse-Position Modulation of Bleaching/Probing Irradiation", J. Fluoresc., 2009, vol. 19, No. 5, pp. 875-880.

Guittet, M., et al., "Use of Vertically-Aligned Carbon Nanotube Array to Enhance the Performance of Electrochemical Capacitors", Proceedings of the 11th International Conference on Nanotechnology IEEE, 2011, pp. 1-6.

Haggenmueller, R., et al., "Aligned single-wall carbon nanotubes in composites by melt processing methods", Chemical Physical Letters, vol. 330, 2000, pp. 219-225.

Han, Z.J., et al., "Superhydrophobic amorphous carbon/carbon nanotube nanocomposites", Applied Physics Letters, 2009, vol. 94, pp. 223106-1-223106-3.

Haq, M.I., et al., "Clinical administration of microneedles: skin puncture, pain and sensation", Biomedical Microdevices, 2009, vol. 11, pp. 35-47.

(56) References Cited

OTHER PUBLICATIONS

Hart, A.J., et al., "Rapid Growth and Flow-Mediated Nucleation of Millimeter-Scale Aligned Carbon Nanotube Structures from a Thin-Film Catalyst", J. Phys. Chem, B, 2006, vol. 110, pp. 8250-8257.

Hattori, H., et al., "A Novel Real-Time Fluorescent Optical Imaging System in Mouse Heart, A Powerful Tool for Studying Coronary Circulation and Cardiac Function", Circ Cardiovasc Imaging, 2009, vol. 2, pp. 277-278.

Hearn, E.M., et al., "Transmembrane passage of hydrophobic compounds through a protein channel wall", Nature, 2009, vol. 458, pp. 367-371.

Hinds, B.J., et al., "Aligned Multiwalled Carbon Nanotube Membranes", Science, vol. 303, 2004, pp. 62-65.

Holzapfel, G.A., et al., "Anisotropic Mechanical Properties of Tissue Components in Human Atherosclerotic Plaques", J. Bio. Eng., 2004, vol. 126, pp. 657-665.

Hong, Y.C., et al., "Superhydrophobicity of a material made from multiwalled carbon nanotubes", Applied Physics Letters, 2006, vol. 88, pp. 24401-1-24401-3.

Hosono, M. et al., "Intraoperative fluorescence imaging during surgery for coronary artery fistula", Interact CardioVasc Thorac Surg, 2010, vol. 10, pp. 476-477.

Hsieh, C.T., et al., "Superhydrophobic behavior of fluorinated carbon nanofiber arrays", Applied Physics Letters, 2006, vol. 88, pp. 243120-1-243120-3.

Hu, H., et al., "Chemically Functionalized Carbon Nanotubes as Substrates for Neuronal Growth", Nanoletters, 2004, vol. 4, No. 3, pp. 507-511.

Huang, H., et al., "Aligned Carbon Nanotube Composite Films for Thermal Management", Advanced Materials, vol. 17, No. 13, 2005, pp. 1652-1656.

Huang, L., et al., "Stable Superhydrophobic Surface via Carbon Nanotubes Coated with a ZnO Thin Film", J. Phys. Chem. B, 2005, vol. 109, pp. 7746-7748.

Huang, X., et al., "Inherent-opening-controlled pattern formation in carbon nanotube arrays", Nanotechnology, vol. 18, 2007, pp. 1-6.

Huber, C.A., et al, "Nanowire Array Composites", Science, vol. 263, 1994, pp. 800-802.

Huczko, A., et al., "Carbon Nanotubes: Experimental Evidence for a Null Risk of Skin Irritation and Allergy?", Fullerene Science and Technology, 2001, vol. 9, No. 2, pp. 247-250.

Huczko, A., et al., "Physiological Testing of Carbon Nanotubes: Are They Asbestos-Like?", Fullerene Science and Technology, 2001, vol. 9, No. 2, pp. 251-254.

Huczko, A., et al., "Pulmonary Toxicity of 1-D Nanocarbon Materials", Fullerenes, Nanotubes, and Carbon Nanostructures, 2005, vol. 13, pp. 141-145.

Ijima, S., "Helical microtubules of graphitic carbon", Nature, vol. 354, 1991, pp. 56-58.

Jia, G., et al., "Cytotoxicity of Carbon Nanomaterials: Single-Wall Nanotube, Multi-Wall Nanotube, and Fullerene", Environ. Sci. Technol., 2005, vol. 39, pp. 1378-1383.

Jin, L., et al., "Alignment of carbon nanotubes in a polymer matrix by mechanical stretching", Applied Physics Letters, vol. 73, No. 9, 1998, pp. 1197-1199.

Jousseaume, V., et al., "Few graphene layers/carbon nanotube composites grown at complementary-metal-oxide-semiconductor compatible temperature", Applied Physics Letters, 2011, vol. 98, pp. 12103-1-12103-3.

Jung, Y.J., et al., "Aligned Carbon Nanotube-Polymer Hybrid Architectures for Diverse Flexible Electronic Applications", Nanoletters, vol. 6, No. 3, 2006, pp. 413-418.

Kam, N.W.S., et al., "Carbon nanotubes as multifunctional biological transporters and near-infrared agents for selective cancer cell destruction", PNAS, vol. 102, No. 33, 2005, pp. 11600-11605.

Kaushik, S., et al., "Lack of Pain Associated with Microfabricated Microneedles", Anesthesia & Analgesia, 2001, vol. 92, pp. 502-504.

Kazaoui, S., et al., "Near-infrared photoconductive and photovoltaic devices using single-wall carbon nanotubes in conductive polymer films", Journal of Applied Physics, 2005, vol. 98, pp. 084314-1-084314-6.

Kim, P., et al., "Thermal Transport Measurements of Individual Multiwalled Nanotubes", Physical Review Letters, vol. 87, No. 21, 2001, pp. 215502-1-2015502-4.

Kim, Yeu-Chun, et al., "Microneedles for drug and vaccine delivery", Adv. Drug Delivery Reviews, 2012, vol. 64, No. 14, pp. 1547-1568.

Kim, Youn-Su, et al., "Out-of-plane growth of CNTs on grapheme for supercapacitor applications", Nanotechnology, 2012, vol. 23, pp. 1-7.

Kondo, D., et al., "Self-organization of Novel Carbon Composite Structure: Graphene Multi-Layers Combined Perpendicularly with Aligned Carbon Nanotubes", Applied Physics Express, 2008, vol. 1, No. 7, pp. 074003-1-074003-3.

Kopterides, P., et al., "Statins for sepsis: a critical and updated review", Clin Microbiol Infect, 2009, vol. 15, No. 4, pp. 325-334.

Krishnan, A., et al., "Young's modulus of single-walled nanotubes", Physical Review B, 1998, vol. 58, No. 20, pp. 14013-14015.

Lahiff, E., et al., "Selective Positioning and Density Control of Nanotubes within a Polymer Thin Film", Nanoletters, vol. 3, No. 10, 2003, pp. 1333-1337.

Lam, C.W., et al., "Pulmonary Toxicity of Single-Wall Carbon Nanotubes in Mice 7 and 90 Days After Intratracheal Instillation", Toxicol Sciences, 2004, vol. 77, pp. 126-134.

Lau, K., et al., "Superhydrophobic Carbon Nanotube Forests", Nanoletters, 2003, vol. 3, No. 12, pp. 1701-1705.

Lee, C., et al., "Measurement of the Elastic Properties and Intrinsic Strength of Monolayer Graphene", Science, 2008, vol. 321, pp. 385-388.

Lee, J.U., "Photovoltaic effect in ideal carbon nanotube diodes", Applied Physics Letters, vol. 87, No. 7, 2005, pp. 073101-1-073101-3.

Li, S., et al., "Super-Hydrophobicity of Large-Area Honeycomb-Like Aligned Carbon Nanotubes", J. Phys. Chem. B, 2002, vol. 106, pp. 9274-9276.

Li, W.Z., et al., "Large-Scale Synthesis of Aligned Carbon Nanotubes", Science, vol. 274, 1996, pp. 1701-1703.

Li, H., et al., "Super-"Amphiphobic" Aligned Carbon Nanotube Films", Angew. Chem. Int. Ed., 2001, vol. 40, No. 9, pp. 1743-1746.

Liu, Z., et al., "Drug delivery with carbon nanotubes for in vivo cancer treatment", Cancer Res., 2008, vol. 68, No. 16, pp. 6652-6660.

Lovich, M.A., et al., "Carrier Proteins Determine Local Pharmacokinetics and Arterial Distribution of Paclitaxel", J. Pharm. Sci., 2001, vol. 90, No. 9, pp. 1324-1335.

Lu, J.P., et al., "Carbon Nanotubes and Nanotube-Based Nano Devices", Int. J. Hi. Spe. Ele. Syst., 1998, vol. 9, No. 1, pp. 101-123.

Lyon, B., et al., "Carbon Nanotube Micro-needles for Rapid Transdermal Drug Delivery", APS DFD Meeting, San Diego, CA, Nov. 18, 2012.

Lyon, B., et al., "Feasibility Study of CNT for Rapid transdermal Drug Delivery", Mater. Res. Soc. Symp. Proc., 2013, vol. 1569, pp. 239-244.

Lyon, B., et al., "Feasibility Study of Carbon Nanotube Microneedles for Rapid Transdermal Drug Delivery", MRS Spring Meeting, San Francisco, CA, Apr. 2013.

Lyon, B., et al., "Carbon Nanotube—Polyimide Composite Microneedles for Rapid Transdermal Drug Delivery", Society of Biomaterials Meeting, Boston, MA, Apr. 2013.

Mamedov, A.A., et al., "Molecular design of strong single-wall carbon nanotube/polyelectrolyte multilayer composites", Nature Materials, 2005, vol. 1, No. 3, pp. 190-194.

Manohara, H.M., et al., "High-current-density field emitters based on arrays of carbon nanotube bundles", J. Vac. Sci. Tech B, 2005, vol. 23, No. 1, pp. 157-161.

McKenzie, J.L., et al., "Decreased functions of astrocytes on carbon nanofiber materials", Biomaterials, 2004, vol. 25, pp. 1309-1317.

(56) References Cited

OTHER PUBLICATIONS

Melechko, A.V., et al., "Vertically aligned carbon nanofibers and related structures: Controlled synthesis and directed assembly", Journal of Applied Physics, vol. 97, No. 4, 2005, pp. 041301-1-041301-39.
Men, X.H., et al., "Superhydrophobic/superhydrophilic surfaces from a carbon nanotube based composite coating", Applied Physics A, 2009, pp. 1-6.
Migliavacca, F., et al., "Expansion and drug elution model of a coronary stent", Comput Methods Biomech Biomed Engin, 2007, vol. 10, No. 1, pp. 63-73.
Min, T., et al., "Effects of hydrophobic surface on skin-friction drag", Physics of Fluids, 2004, vol. 16, No. 7, pp. L55-L58.
Monteiro-Riviere, N.A., et al., "Multi-walled carbon nanotube interactions with human epidermal keratinocytes", Toxicol Letters, 2005, vol. 155, pp. 377-384.
Morjan, R.E., et al., "High growth rates and wall decoration of carbon nanotubes grown by plasma-enhanced chemical vapour deposition", Chemical Physics Letters, vol. 383, 2004, pp. 385-390.
Muller, J., et al., "Respiratory toxicity of multi-wall carbon nanotubes", Toxicol Appl Pharmacol, 2005, vol. 207, pp. 221-231.
Nerushev, O.A., et al., "The temperature dependence of Fe-catalysed growth of carbon nanotubes on silicon substrates", Physica B, vol. 323, 2002, pp. 51-59.
Nessim, G.D., et al., "Tuning of Vertically-Aligned Carbon Nanotube Diameter and Areal Density through Catalyst Pre-Treatment", Nano Letters., 2008, vol. 8, No. 11, pp. 3587-3593.
Noca, F., et al., "NanoWicks: Nanofiber-Patterned Surfaces for Passive Fluid Transport, Nanopumping, Ultrafiltration, Nanomixing, and Fluidic Logic", NASA Tech Briefs, 2007, pp. 1-7.
Oreopoulos, J., et al., "Combinatorial microscopy for the study of protein-membrane interactions in supported lipid bilayers: Order parameter measurements by combined polarized TIRFM/AFM", J. Struct. Biol., 2009, vol. 168, pp. 21-36.
Panchagnula, R., et al., "Effect of Lipid Bilayer Alteration on Transdermal Delivery of a High-Molecular-Weight and Lipophilic Drug: Studies with Paclitaxel", J. Pharm. Sci., 2004, vol. 93, No. 9, pp. 2177-2183.
Pandolfo, A.G., et al., "Carbon properties and their role in supercapacitors", Journal of Power Sources, 2006, vol. 157, pp. 11-27.
Parekh, H., et al., "The Transport and Binding of Taxol", Gen. Pharmac., 1997, vol. 29, No. 2, pp. 167-172.
Pernodet, N., et al., "Pore size of agarose gels by atomic force microscopy", Electrophoresis, 1997, vol. 18, pp. 55-58.
Prausnitz, M.R., et al., "Transdermal drug delivery", Nature Biotechnology, 2008, vol. 26, No. 11, pp. 1261-1268.
Price, R.L., et al., "Selective bone cell adhesion on formulations containing carbon nanofibers", Biomaterials, 2003, vol. 24, pp. 1877-1887.
Raravikar, N.R., et al., "Synthesis and Characterization of Thickness-Aligned Carbon Nanotube-Polymer Composite Films", Chem. Mater., vol. 17, No. 5, 2005, pp. 974-983.
Raravikar, N.R., et al., "Embedded Carbon-Nanotube-Stiffened Polymer Surfaces", Small, vol. 1, No. 3, 2005, pp. 317-320.
Ren, Z.F., et al., "Synthesis of Large Arrays of Well-Aligned Carbon Nanotubes on Glass", Science, vol. 282, 1998, pp. 1105-1107.
Roxhed, N., et al., "Painless Drug Delivery Through Microneedle-Based Transdermal Patches Featuring Active Infusion", IEEE Transactions on Biomedical Engineering, 2008, vol. 55, No. 3, pp. 1063-1071.
Ruoff, R.S., et al., "Is $C_{60}$ stiffer than diamond?", Nature, 1991, vol. 350, pp. 663-664.
Sansom, E.B., "Experimental Investigation on Patterning of Anchored and Unanchored Aligned Carbon Nanotube Mats by Fluid Immersion and Evaporation", PhD Thesis, California Institute of Technology, Pasadena, CA, 2007.
Sansom, E.B., et al., "Controlled partial embedding of carbon nanotubes within flexible transparent layers", Nanotechnology, vol. 19, No. 3, 2008, pp. 5302-5307.

Scheller, B., et al., "Paclitaxel Balloon Coating, a Novel Method for Prevention and Therapy of Restenosis", Circulation, vol. 110, No. 7, 2004, pp. 810-814.
Scheuplein, R.J., et al., "Permeability of the Skin", Physiological Reviews, 1971, vol. 51, No. 4, pp. 702-747.
Scheuplein, R.J., Chapter 19: Permeability of the skin, Handbook of Physiology-Reactions to Environmental Agents, 2011, pp. 299-322.
Sethi, S., et al., "Gecko-Inspired Carbon Nanotube-Based Self-Cleaning Adhesives", Nanoletters, vol. 8, No. 3, 2008, pp. 822-825.
Shvedova, A.A., et al., "Exposure to Carbon Nanotube Material: Assessment of Nanotube Cytotoxicity Using Human Keratinocyte Cells", J. Toxicol. Environ. Health, Pat A, 2003, vol. 66, pp. 1909-1926.
Simon, P., et al., "Materials for electromechanical capacitors", Nature Materials, 2008, vol. 7, pp. 845-854.
Sinha, N., et al., "Carbon Nanotubes for Biomedical Applications", IEEE Transactions on Nanobioscience, vol. 4, No. 2, 2005, pp. 180-195.
Suh, J.S., et al., "Highly ordered two-dimensional carbon nanotube arrays", Applied Physics Letters, vol. 75, No. 14, 1999, pp. 2047-2049.
Talapatra, S., et al., "Direct Growth of Aligned Carbon Nano-tubes on Bulk Metals", Nature Nanotechnology, 2006, vol. 1, pp. 112-116.
Tamura, K., et al., "Effects of Micro/Nano Particle Size on Cell Function and Morphology", Key Engineering Materials, 2004, vols. 254-256, pp. 919-922.
Tanaka, E., et al., "Real-Time Assessment of Cardiac Perfusion, Coronary Angiography, and Acute Intravascular Thrombi Using Dual-Channel Near-Infrared Fluorescence Imaging", Thorac Cardiovasc Surg., 2009, vol. 138, No. 1, pp. 133-140.
Tepe, G., et al., "Paclitaxel-coated Angioplasty Catheters for Local Drug Delivery", Touch Briefings—Interventional Cardiology, 2007, pp. 61-63.
Tian, B., et al., "Coaxial silicon nanowires as solar cells and nanoelectronic power sources", Nature, vol. 449, 2007, pp. 885-888.
Van Den Bossche, P., et al., "SUBAT: An assessment of sustainable battery technology", Journal of Power Sources, 2006, vol. 162, No. 2, pp. 913-919.
Veedu, V.P., et al., "Multifunctional composites using reinforced laminae with carbon-nanotube forests", Nature Materials, 2006, vol. 5, pp. 457-462.
Wagner, H.D., et al., "Stress-induced fragmentation of multiwall carbon nanotubes in a polymer matrix", Applied Physics Letters, vol. 72, No. 2, 1998, pp. 188-190.
Wang, G.X., et al., "Growth and Lithium Storage Properties of Vertically Aligned Carbon Nanotubes", Metals and Materials Intl, 2006, vol. 12, No. 5, pp. 413-416.
Wang, Z., et al., "Impact dynamics and rebound of water droplets on superhydrophobic carbon nanotube arrays", Applied Physics Letters, 2007, vol. 91, pp. 023105-1-023105-3.
Wardle, B.L., et al., "Fabrication and Characterization of Ultrahigh-Volume-Fraction Aligned Carbon Nanotube-Polymer Composites", Adv. Mater., 2008, vol. 20, pp. 2707-2714.
Warheit, D.B., et al., "Comparative Pulmonary Toxicity Assessment of Single-wall Carbon Nanotubes in Rats", Toxicol. Sciences, 2004, vol. 77, pp. 117-125.
Waseda, K., et al., "Intraoperative Fluorescence Imaging System for On-Site Assessment of Off-Pump Coronary Artery Bypass Graft", JACC: CardioVasc Imaging, 2009, vol. 2, No. 5, pp. 604-612.
Webster, T.J., et al., "Nano-biotechnology: carbon nanofibres as improved neural and orthopaedic implants", Nanotechnology, 2004, vol. 15, pp. 48-54.
Wermeling, D.P., et al., "Microneedles permit transdermal delivery of a skin-impermeant medication to humans", PNAS, 2008, vol. 105, No. 6, pp. 2058-2063.
Wong, E.W., et al., "Nanobeam Mechanics: Elasticity, Strength, and Toughness of Nanorods and Nanotubes", Science, vol. 277, 1997, pp. 1971-1975.
Wu, W., et al., "Covalently Combining Carbon Nanotubes with Anticancer Agent: Preparation and Antitumor Activity", ACS Nano, 2009, vol. 3, No. 9, pp. 2740-2750.

(56) References Cited

OTHER PUBLICATIONS

Xie, XL, et al., "Dispersion and alignment of carbon nanotubes in polymer matrix: A review", Mat. Science and Engineering R, vol. 49, No. 4, 2005, pp. 89-112.

Xu, J., et al., "Enhanced Thermal Contact Conductance Using Carbon Nanotube Array Interfaces", IEEE Transactions on Components and Packaging Technologies, 2006, vol. 29, No. 2, pp. 261-267.

Xu, Z., et al., "Multiwall Carbon Nanotubes Made of Monochirality Graphite Shells", J. Am. Chem. Soc., vol. 128, No. 4, 2006, pp. 1052-1053.

Yang, D, et al., "Hydrophilic multi-walled carbon nanotubes decorated with magnetite nanoparticles as lymphatic targeted drug delivery vehicles", Chem. Commun., 2009, pp. 4447-4449.

Yang, Z., et al., "Noncovalent-wrapped sidewall functionalization of multiwalled carbon nanotubes with polyimide", Polymer Composites, 2007, vol. 28, No. 1, pp. 36-41.

Yang, ZP, et al., "Experimental Observation of an Extremely Dark Material Made by a Low-Density Nanotube Array", Nanoletters, vol. 8, No. 2, 2008, pp. 446-451.

Yurdumakan, B., et al., "Synthetic gecko foot-hairs from multiwalled carbon nanotubes", Chem. Comm., vol. 30, 2005, pp. 3799-3801.

Zhang, L., et al., "Single-Walled Carbon Nanotube Pillars: A Superhydrophobic Surface", Langmuir, 2009, vol. 25, No. 8, pp. 4792-4798.

Zhang, L.L., et al., "Graphene-based materials as supercapacitor electrodes", J. Matter. Chem., 2010, vol. 20, pp. 5893-5992.

Zhao, L., et al., "Porous Silicon and Alumina as Chemically Reactive Templates for the Synthesis of Tubes and Wires of SnSe, Sn, and $SnO_2$"", Angew. Chem. Int. Ed., vol. 45, 2006, pp. 311-315.

Zhou, J.J., et al., "Flow conveying and diagnosis with carbon nanotube arrays", Nanotechnology, vol. 17, No. 19, 2006, pp. 4845-4853.

Zhu, L., et al., "Superhydrophobicity om Two-Tier Rough Surfaces Fabricated by Controlled Growth of Aligned Carbon Nanotube Arrays Coated with Fluorocarbon", Langmuir, 2005, vol. 21, pp. 11208-11212.

Zilberman, M., et al., "Paclitaxel-eluting composite fibers: Drug release and tensile mechanical properties", J. Biomed. Mater. Res., 2008, vol. 84A, pp. 313-323.

\* cited by examiner

METHOD FOR PRODUCING GRAPHENE OXIDE WITH TUNABLE GAP

RELATED APPLICATIONS

The current application is a continuation application of U.S. patent application Ser. No. 13/316,771 filed Dec. 12, 2011 which application claimed priority to U.S. Provisional Application No. 61/422,092, filed Dec. 10, 2010, the disclosures of which are incorporated herein by reference.

FIELD OF THE INVENTION

The current invention is directed toward a method for producing a semiconducting graphene oxide material in which the oxidation is confined to the graphene layer.

BACKGROUND OF THE INVENTION

Graphene, a material comprising a lattice of carbon atoms positioned in a 'honeycomb-type' arrangement and tightly joined by in-plane $sp^2$ bonds, has garnered much attention from research communities because its unique electrical and mechanical properties make it potentially ideally suited for various engineering applications, such as nanoelectronics and integrated circuits. Compared to other conductive and semiconductive materials, graphene has a superior carrier mobility and low resistivity, making it a promising candidate for integrated circuits. (Castro Neto A H, et al., *Rev Mod Phys*. 2009, 81, 109-62; Geim A and Novoselov K., *Nature Materials*. 2007, 6, 183-91; Novoselov K S, et al., *Science*. 2004, 306, 666-9; Novoselov K S, et al., *Nature*. 2005, 438, 197-200; Novoselov K S; McCann E, et al. *Nat Phys*. 2006, 2, 177-80; and Zhang Y, et al., *Nature*. 2005, 438, 201-4, the disclosures of which are incorporated herein by reference.)

However, graphene is inherently a semimetallic material—as opposed to a semiconductor material—and this limits its usability. (See, e.g., Oosting a J B, et al., *Nature Materials*. 2007, 7, 151-7; Ni Z H, et al., *ACS nano*. 2008, 2, 2301-5; Pereira V M, et al., *Physical Review B*. 2009, 80, 045401; Han M Y, et al., *Phys Rev Lett*. 2007, 98, 206805-8; Nakada K, et al., *Phys Rev B*. 1996, 54, 17954-61; and Ponomarenko L A, et al., *Science* 2008, 320, 356-8, the disclosures of which are incorporated herein by reference.) As a result, researchers have employed a number of methods to introduce a finite band gap within graphene, and thereby convert it into a semiconductor. One approach to introduce an energy gap opening in graphene is to break its lattice symmetry using foreign atoms such as hydrogen, gold, nitrogen, oxygen, and organic molecular dopants. (See, e.g., Bostwick A, et al., *Physical Review Letters*. 2009, 103, 056404; Balog R, et al., *Nat Mater*. 2010, 9, 315-9; Sessi P, et al., *Nano letters*. 2009, 9, 4343-7; Geirz I, et al., *Nano Lett*. 2008, 8, 4603-7; Wehling T, et al., *Nano letters*. 2008, 8, 173-7; Luo Z, et al., *Appl Phys Lett*. 2009, 94, 111909-11; Leconte N, et al., *ACS nano*. 2010, 4, 4033-8; Nourbakhsh A, et al., *Nanotechnology*. 2010, 21, 435203-11; Kim D C, et al., *Nanotechnology*. 2009, 20, 375703, Alzina F, et al., *Physical Review B*. 2010, 82, 075422 Gokus T, et al., *ACS nano*. 2009, 3, 3963-8; Childres I, et al., *New Journal of Physics*. 2011, 13, 025008; Dong X, et al., *Small*. 2009, 5, 1422-6; and Lu Y H, et al., *The Journal of Physical Chemistry B*. 2008, 113, 2-5, the disclosures of which are incorporated herein by reference.)

For example, researchers have used wet oxidation methods to insert foreign atoms into the graphene structure. These impurities alter the $sp^2$ carbon hybridization in graphene to an $sp^3$ carbon hybridization, and eliminate the π-bonds that facilitate charge transport across the graphene plane. Consequently, with diminished charge transport the desired band gap is obtained. (See, e.g., Elias D C, et al., *Science*. 2009, 323, 610-3; Sofo J O, et al., *Physical Review B*. 2007, 75, 153401; and Boukhvalov D W, et al., *Physical Review B*. 2008, 77, 035427, the disclosures of which are incorporated herein by reference.) However, the wet oxidation process is less than ideal: it typically uses harsh chemicals, such as strong acids and oxidizing agents; it takes a significantly long time to complete; and it does not allow for the creation of site specific oxidation, which substantially limits the usability of this modified graphene. (See, e.g., Hummers W S and Offeman R E, *J Am Chem Soc*. 1958, 80, 1339; Park S and Ruoff R, *Nature nanotechnology*. 2009, 4, 217-24; Li D, et al., *Nat Nanotechnol*. 2008, 3, 101-5; Sun X, et al., *Nano Res*. 2008, 1, 203-12; Becerril H A, et al., *Nano Lett*. 2008, 2, 463-70, the disclosures of which are incorporated herein by reference.)

Researchers have also experimented with using plasma oxidation, a dry oxidation method, to create a graphene oxide semiconductor material. This method is advantageous in a number of respects: it does not use any harmful chemicals; it is a more rapid process; and it allows for site specific oxidation. For example, Nourbakhsh et al. have fabricated and characterized such a graphene oxide layer. (See Bandgap Opening in Oxygen Plasma-Treated Graphene, Nourbakhsh et al. *Nanotechnology* 2010, 21, 435203-11, the disclosure of which is incorporated herein by reference.)

Previous studies also show that the p-doping level, electron-electron scattering rate, and the total density of states of an UV/ozone treated graphene are dictated by the defect density associated with surface concentration of oxygenated functional groups and oxygen molecule. At a very low defect density, the p-doping level and electron-electron scattering rate increase in proportion to the increase in defect density. At a higher defect density, a continuous decay and smoothing of the van Hove singularities becomes apparent, and a further increase in the defect density results in a significant drop in the conductance. This indicates a strong Anderson metal-insulator transition, with an overall change in the carrier concentration in the order of $10^{12}$ cm$^{-2}$. These studies also show that an increase in defect density becomes increasingly difficult as the oxygen adsorption reaches a constant value after a certain UV/ozone exposure time. (See, e.g., Leconte N, et al., *ACS nano*. 2010, 4, 4033-8; Nourbakhsh A, et al., *Nanotechnology*. 2010, 21, 435203-11; Kim D C, et al., *Nanotechnology*. 2009, 20, 375703, Alzina F, et al., *Physical Review B*. 2010, disclosed above.)

Similar electronic transport behaviors are also observed in oxygen plasma treated graphene, where the p-doping level increases with the increase of oxygen plasma exposure, rendering the oxidized graphene unipolar. As the oxygen plasma exposure increases further, the level of disorder in the structural symmetry of graphene becomes more pronounced, which leads to a decrease in conductance and mobility, as well as a transition from semimetallic to semiconducting behavior. However, the prior art has yet to develop a process for the production of a semiconductor graphene oxide material suitable for practical applications. For example, although Nourbakhsh et al. discuss characterizing a graphene oxide layer created by a plasma oxidation process, the authors do not provide any guidance on how to avoid the creation of oxides on the substrate surface. For example, the authors incorrectly suggest that the band gap that can be created using this dry oxidation process can be as high as 3.6 eV (they reached this figure via calculation). It has now been discovered that such high band-gaps are impossible absent the destruction of the graphene oxide band gap. Accordingly a need exists for improved fabrication processes capable of forming graphene oxide materials in which the oxidation is confined within the graphene layer such that they can be used in practical applications.

SUMMARY OF THE INVENTION

The present invention is directed to a novel fabrication method that allows for a versatile but precise manipulation of graphene so as to develop graphene oxide material that possesses an appreciable, and determinable, band gap, and in which the oxidation is confined to the graphene layer. This novel fabrication method can thus develop graphene oxides that are optimized for practical use. The process includes subjecting a graphene sample to a dry oxidation process for a pre-determined period of time, wherein the length of oxidation exposure determines the magnitude of the band gap.

In one embodiment of the invention, masks are used in conjunction with the oxidation process, and the masking and oxidation steps are optionally iterated in order to achieve a desired configuration.

In yet another embodiment of the invention, a UV/Ozone oxidation process, which can allow for a greater control in achieving a desired band gap, is used as the oxidation process.

In still another embodiment, a remote indirect plasma oxidation treatment, which allows for more expedient oxidation while providing a safer oxidation treatment as compared to a direct plasma oxidation treatment, is used as the oxidation process.

BRIEF DESCRIPTION OF THE DRAWINGS

These and other features, aspects, and advantages of the present invention will be more fully understood when considered with respect to the following detailed description, appended claims, and accompanying drawings, wherein:

DETAILED DESCRIPTION OF THE INVENTION

The current invention is directed to a precise, versatile, and novel dry oxidation method of fabricating a semiconducting graphene material that can be used in a number of practical applications, such as: nanoelectronics, high frequency low noise field effect transistors which can be used for amplifiers, full wave rectifiers, RF resonators and switches, and integrated circuits. In particular, the current invention recognizes that absent very rigorous process parameters, graphene oxide layers are prone to the development of substrate oxides that can negatively impact the electronic characteristics and usability of the materials for practical applications, and has further discovered that by confining the oxidation to the graphene layer it is possible to prevent these substrate oxides.

Figure 1:
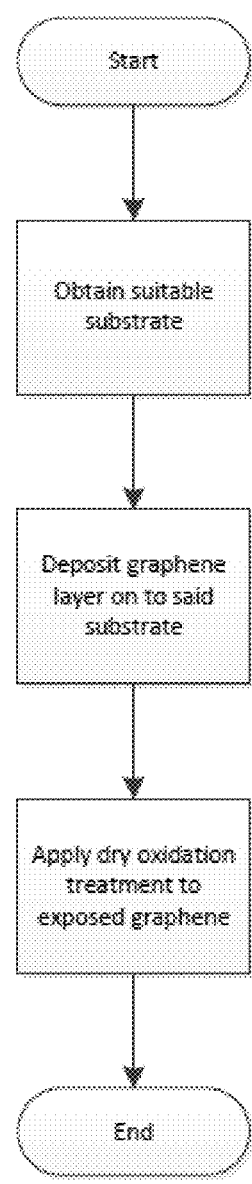
FIG. 1 provides a flow chart of an exemplary embodiment of a process for forming a graphene oxide material in accordance with the current invention.

FIG. 1 provides a flowchart of a fabrication process in accordance with some exemplary embodiments of the invention. As shown, in some embodiments, the fabrication process includes: 1) obtaining a suitable substrate; 2) depositing a graphene layer onto said substrate; and 3) subjecting the graphene layer to a dry oxidation treatment, wherein the dry oxidation treatment is confined to the graphene layer to prevent the development of oxide interaction with the substrate. In particular, as will be described in greater detail below, the current invention provides methods of controlling the flux of oxidation and overall concentration of oxide in the graphene surface to ensure that oxidation is confined within the graphene layer, and more particularly, such that oxygen ions do not penetrate through the graphene to form oxides on the underlying substrate thereby resulting in the creation of unwanted substrate oxides.

The following sections will elaborate on these basic fabrication steps, and will also provide descriptions of alternative embodiments that may be used in accordance with the above fabrication steps:

Substrate Layer

A variety of substrates may typically be used in the fabrication of electronic devices. As described above, the current invention is directed to graphene oxide materials that may be used in practical electronic applications. Accordingly, any substrate suitable for use as a structural foundation for a practical electronic device may be used with the current invention. For example, some commonly used substrate materials include: silicon, silicon dioxide, aluminum oxide, sapphire, germanium, gallium arsenide, an alloy of silicon and germanium, and indium phosphide, and it should be understood that any of these substrate materials may be used with the fabrication process of the current invention. In making a selection of an appropriate substrate material in accordance with the current invention, it will be understood that it is preferable that the influence of the processing applications on the substrate be minimized. In some cases this can be difficult, because the substrate is typically bonded to the electrical device prior to various processing applications, and so they too are subjected to those processing applications. In particular, as discussed above and in following sections, it is important to the creation of high quality graphene oxide materials that the dry oxidation treatment be confined to the graphene layer. Accordingly, in some embodiments the substrate material can be chosen such that the material is resistant to the production of surface oxides from exposure to oxygen ions.

Graphene Layer

As described above, once a substrate material has been chosen, a graphene layer must be deposited thereon. With regard to this step of the fabrication process, it will be understood that the deposition of graphene can be achieved in any manner suitable for the formation of a continuous graphene layer on the chosen substrate.

For example, in one embodiment of the invention, graphene samples can be grown by chemical vapor deposition techniques on nickel coated $SiO_2$/Si substrates at 900° C. under a flow of 25 sccm methane and 1500 sccm hydrogen precursor gases. The sample can then be exposed to vacuum-pyrolysis treatment at an elevated temperature of 250° C. and a mild vacuum at 2.5 torr for 24 hours to remove the residual oxygen adsorbed during the growth process. Alternatively, in another embodiment of the invention, the graphene substrate configuration can be achieved by depositing single-layer graphene (SLG) flakes by micromechanical exfoliation on n-doped Si substrates covered with a 90 nm thermally grown $SiO_2$ film.

It should be understood that the above processes are merely provided as examples and simply represent possible embodiments of the invention that illustrate how the desired substrate-graphene configuration can be achieved. The enumeration of these embodiments is not meant to imply that they represent the only ways a substrate-graphene configuration can be achieved in accordance with this invention—any method of obtaining this graphene substrate configuration can be used consistent with the invention.

Dry Oxidation and Variability of the Band Gap

Figure 2:
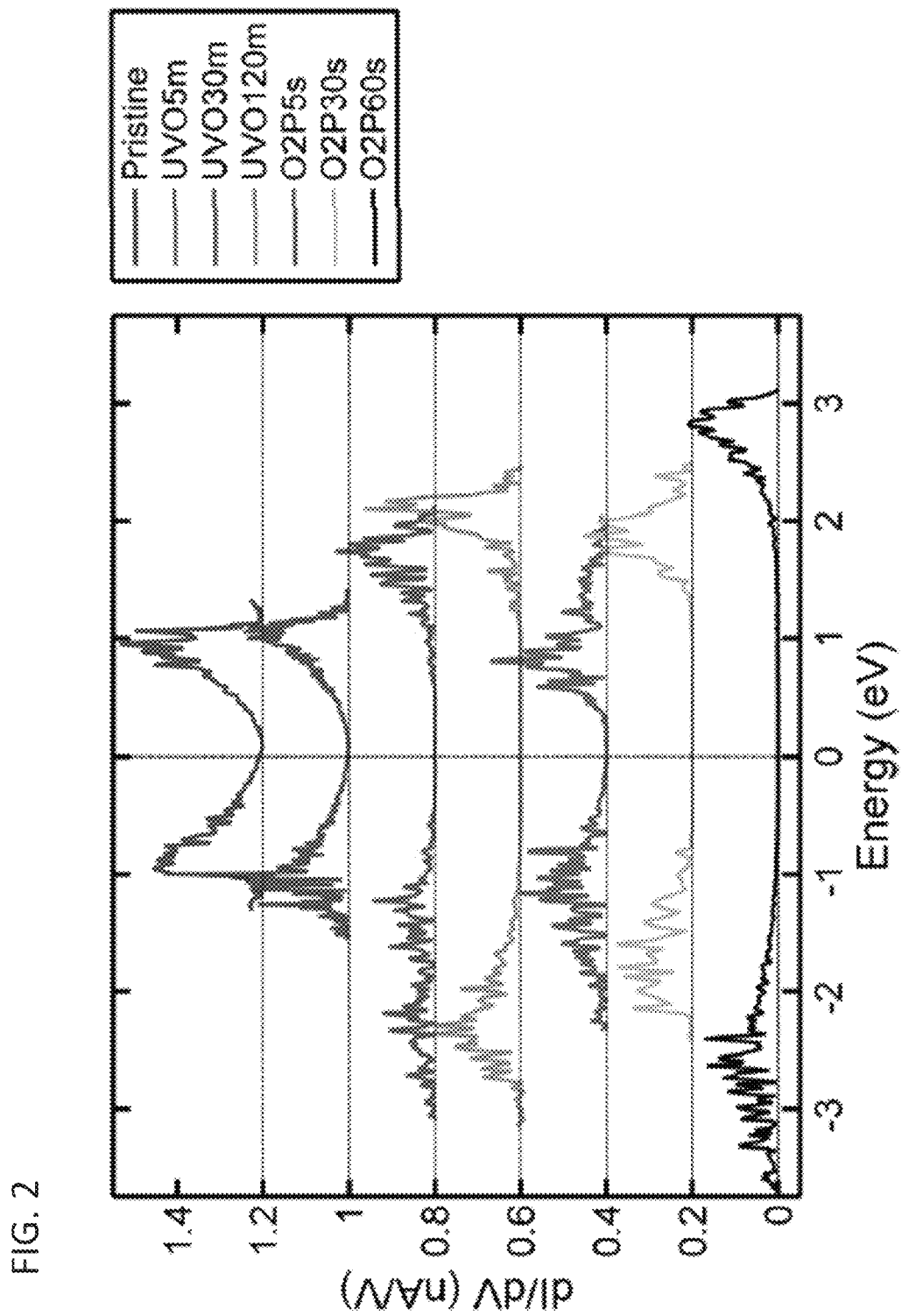
FIG. 2 provides a data plot showing exemplary experimental results demonstrating how the band gap in a graphene oxide grows over time after exposure to oxidation.

As previously described with regard to the flow chart in FIG. 1, in some embodiments of the invention the graphene is exposed to a dry oxidation treatment. Dry oxidation techniques (as opposed to wet oxidation techniques) oxidize via a gas phase process and confer the following benefits: they typically do not require the use of any harsh chemicals; they are relatively quick procedures; and they are compatible with the use of masks. FIG. 2 provides a data plot showing how the band gap in a graphene oxide grows over time after exposure to both plasma and UV/ozone dry oxidation processes. In this respect, any dry oxidation technique suitable for the controlled deposition of oxygen ions on a surface may be used with the current invention, including, for example, direct plasma oxidation treatment, indirect remote plasma oxidation treatment, and UV/Ozone treatment.

Figure 3:
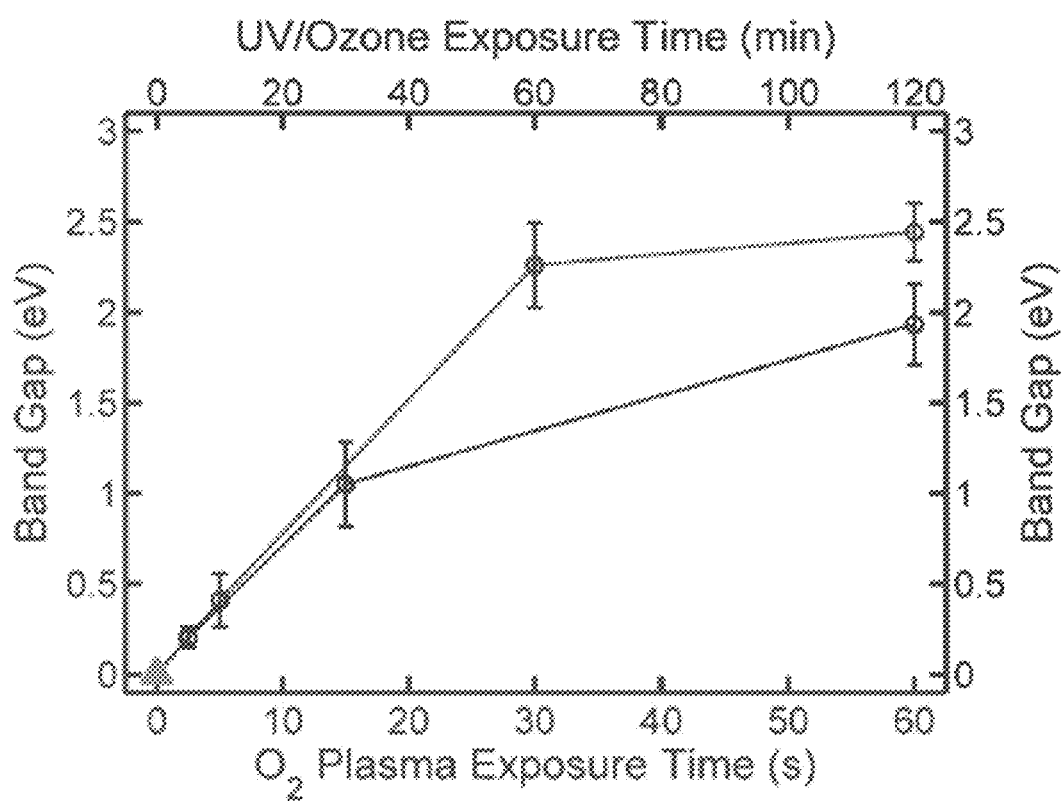
FIG. 3 provides data plots showing exemplary experimental results demonstrating the band gap in a graphene oxide after exposure to (1) a UV/Ozone oxidation treatment, and (2) a plasma oxidation treatment.

Importantly, any of the above mentioned dry oxidation techniques would allow for the creation of specific desired band gaps within the graphene material to be achieved by controlling the oxidation process. Generally speaking, a longer exposure to the oxidation process will result in a larger band gap. The longer exposure time is understood to allow the dry oxidation treatment to induce oxygen adsorbates onto the graphene layer. These oxygen adsorbates introduce defects in the graphene's inherent $sp^2$ structure, and thereby disrupt the graphene's inherent if-bond network (the if-bond network is what facilitates the electron mobility and charge transport across the graphene plane). FIG. 3 correlates the band gap with the concentration of oxygen. Unaltered graphene has an oxygen concentration of roughly 9%, whereas graphene with a band gap of roughly 2.5 eV has an oxygen concentration of roughly 21%. Thus, measuring the oxygen concentration can help verify the presence of a band gap, and by controlling the concentration of oxygen it is possible to engineer the band gap of the graphene oxide to be between 0 and 2.5 eV.

Figure 4:
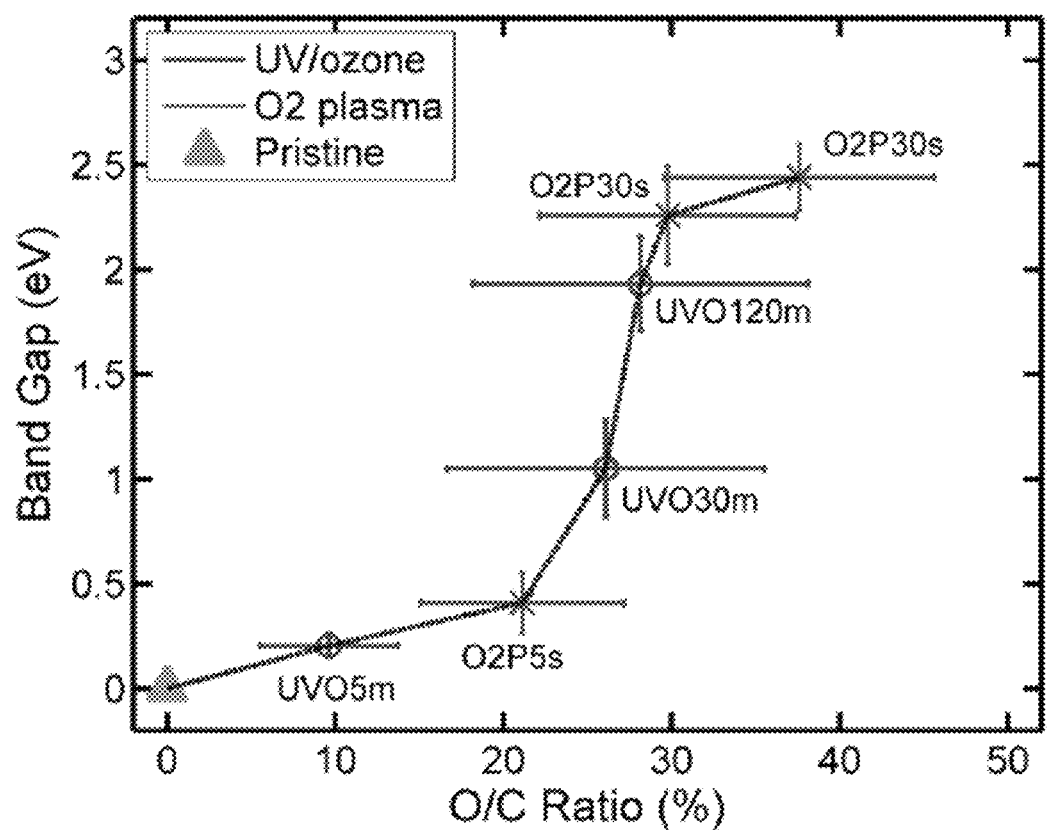
FIG. 4 provides a data plot showing exemplary experimental results correlating the size of the band gap with the oxygen concentration.

Moreover, the specific type of dry oxidation treatment used also impacts the variability of the band gap—the use of a plasma oxidation treatment increases the band gap much more rapidly than does the use of a UV/Ozone oxidation treatment. This difference in rapidity is thought to be a function of the different concentrations of reactive oxygen species per unit time present in both treatments. FIG. 4 illustrates the difference, and shows that a 60 second plasma oxidation treatment yields a 2.5 eV band gap, while a 2 hour UV/Ozone treatment yields just a 2 eV band gap. Therefore, using the UV/Ozone oxidation treatment allows the band gap to be controlled with greater resolution. Conversely, using either of the plasma oxidation techniques allows a desired band gap to be achieved much more rapidly.

Although a number of different dry oxidation processes may be used with the current invention to produce graphene oxides, and to engineer the band gap characteristics of these materials, with regard to the current invention it is of critical importance that the oxidation treatment should be confined to the graphene layer, and that, in turn, the substrate should not be exposed to the oxidation process. Exposure of the substrate to oxidation, and or leaching of the oxide from the graphene layer to the substrate can lead to the formation of oxides on the substrate, which can negatively impact the graphene oxide material. Accordingly, by controlling the process parameters to ensure that the oxidation is confined within the graphene layer it is possible to improve surface quality and produce substantially defect-free graphene oxide semiconductor material suitable for practical use.

In view of this, the inventive oxidation process is tailored to avoid the formation of substrate oxides and ensure confinement of the oxide within the graphene layer.

First, in some such embodiments, the concentration of the oxide is carefully monitored and controlled to ensure that it does not exceed a maximum concentration of 21%. It has been determined that oxygen concentrations of greater than 21% result in the creation of substrate oxides, and the subsequent formation of oxides with the substrate surface.

Second, in some embodiments an indirect remote plasma oxidation treatment is used. Such an indirect remote plasma treatment is less vigorous, and therefore reduces the possibility of damage to the graphene surface, and/or the likelihood that oxygen ions reach the substrate surface.

With the above process restrictions in mind, the following embodiments of the invention are provided as examples and illustrate how dry oxidation treatments can be applied to a graphene sample in accordance with the invention:

(1) In one embodiment of the invention, a UV/Ozone treatment is applied at standard room temperature and pressure for a selected period of time such that the concentration of the oxygen within the graphene oxide layer does not exceed 21%.

(2) In another embodiment of the invention, a remote oxygen plasma machine (for example, the Tepla M4L) is used under 20 Watts of RF power at a constant oxygen flow rate of 20 sccm and chamber pressure of 500 mTorr for an appropriate amount of time. Note that in no case should more than 50 Watts of RF power be used when using the plasma oxidation treatment method. Again, the oxygen content within the graphene layer must be confined to 21% or less.

It should be understood that these are simply embodiments of the invention that illustrate how dry oxidation treatments may be applied, and are not meant to limit the scope of the invention—any suitable dry oxidation treatment method may be used in conjunction with the invention.

Masking

Although the above discussion has described basic embodiments of the invention, in some alternative embodiments the fabrication process is used in conjunction with masking techniques to allow for the creation of graphene/ graphene oxide materials with multi-function surfaces and/ or variable band gap regions. Masking is a technique used in circuit manufacture that allows for the creation of multiple regions with distinct electrical properties within a single layer. Essentially, masks are employed prior to the material's treatment, thereby protecting the covered region from the treatment's influence.

Figure 5:
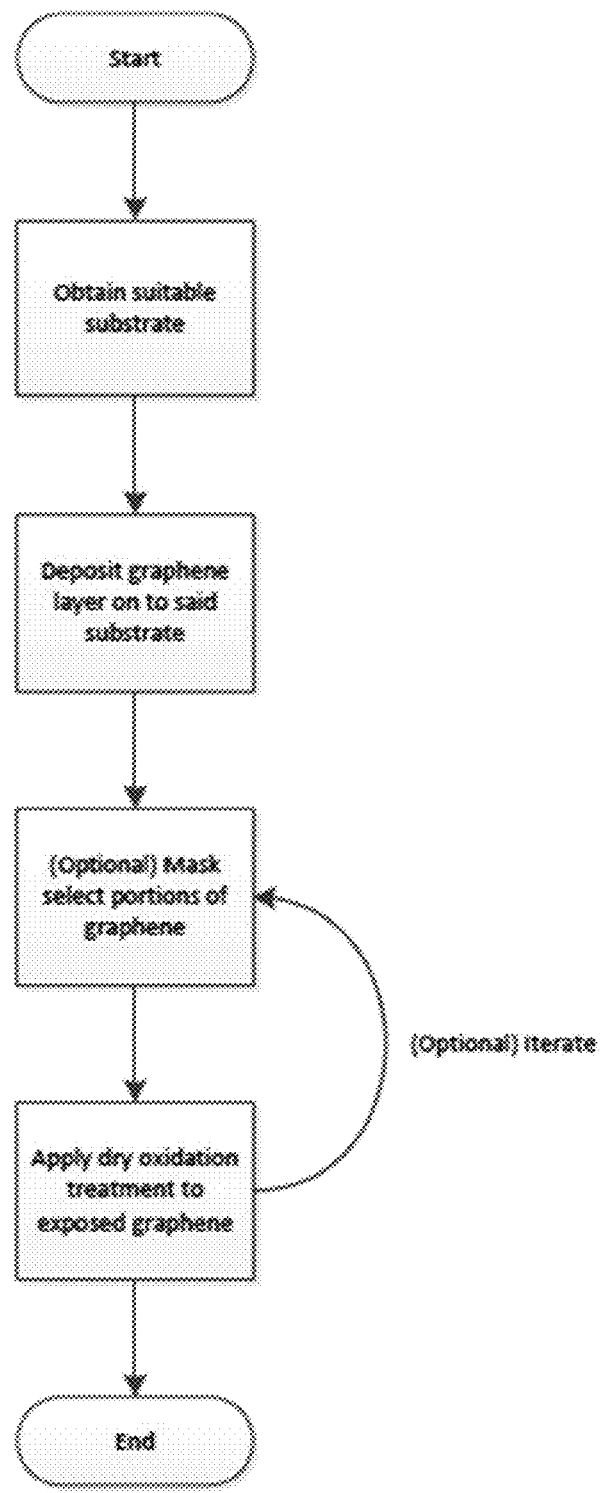
FIG. 5 provides a flow chart of an exemplary embodiment of a process for using a masking technique in conjunction with the process for forming graphene oxide material in accordance with the current invention.

Some such embodiments, a summary of which is shown in the flow chart provided in FIG. 5, include 1) obtaining a suitable substrate; 2) depositing a graphene layer onto said substrate; 3) masking portions of the graphene layer; 4) subjecting the graphene layer to a dry oxidation treatment, wherein the dry oxidation treatment is confined to the graphene layer; and 5) optionally reiterating steps 3 and 4 if a more intricate electronic configuration is desired.

Thus, in one embodiment of this invention, masking can be employed prior to the dry oxidation treatment. Any region protected by the mask during an initial dry oxidation treatment will retain graphene's inherent semimetallic properties. Using this technique, a graphene oxide material with multiple regions can be developed. Accordingly, it is possible to incorporate masking techniques with the current fabrication technique allows for the creation of more intricate graphene samples.

Figure 6:
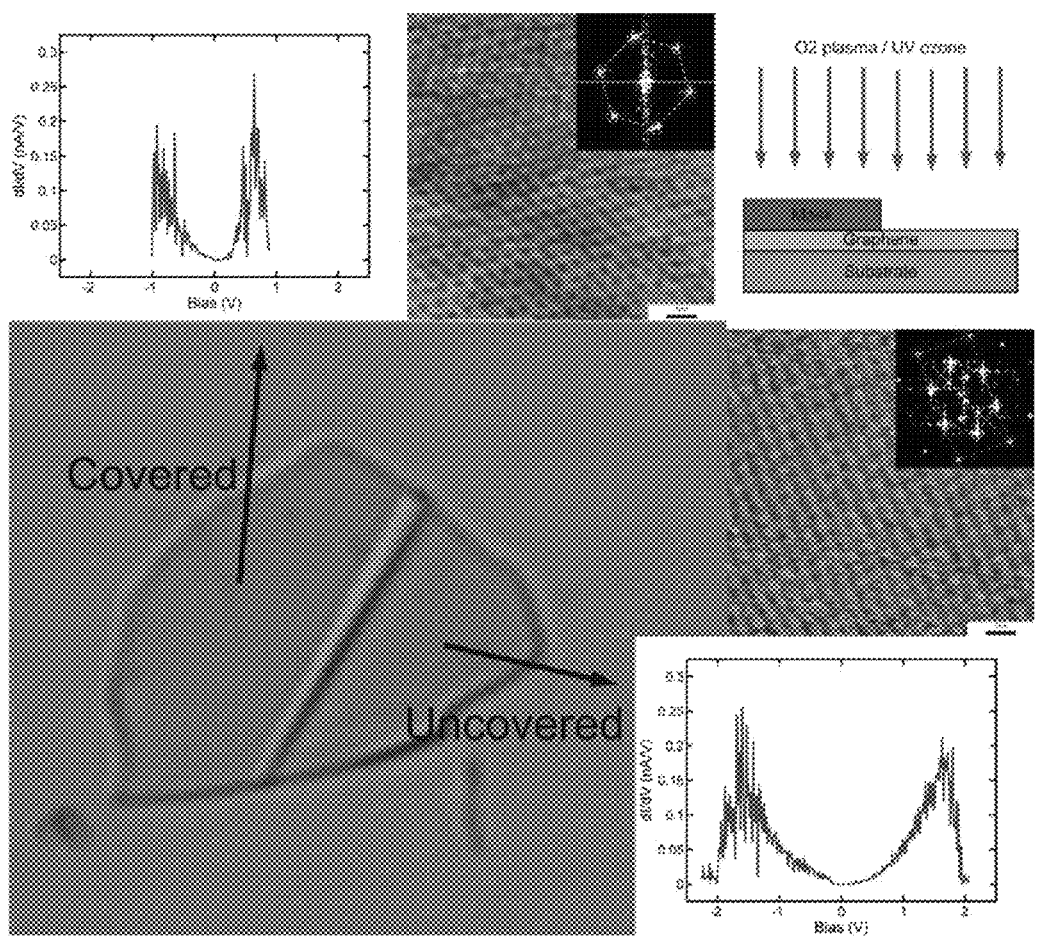
FIG. 6 provides an optical microscopy image of partially oxidized graphene layer after 10 seconds oxidation at RF power of 20 watt, the covered region exhibits energy gap opening of ~0.1 eV (top left), while the uncovered region exhibits energy gap of ~0.4 eV (bottom right), a physical mask is used to partially cover a graphene layer from being exposed to oxygen plasma or UV/ozone treatment (top right).

As shown in FIG. 6, in order to achieve site specific oxidation, a physical mask is used to partially cover the graphene layer, preventing the covered region from being exposed to oxygen plasma or UV/ozone treatment. The unexposed region retains its gapless electronic properties, while the energy gap of the exposed region starts to open up depending on the exposure time and power. For instance, in FIG. 6, after 10 seconds of oxidation using oxygen plasma treatment at RF power of 20 watt, the uncovered region exhibits an energy gap of ~0.4 eV, while the covered region can still be considered gapless.

Moreover, the masking and oxidation processes can be iterated to achieve even further intricate semiconductor patterns. For example, a masking layer can be employed during an initial oxidation process, and then removed during a second oxidation cycle. The resulting material would have two regions with different band gaps: the region that was subject to the initial mask could have some appreciable band gap, whereas the region that was not exposed to the masking but still subjected to both oxidation treatments would have and even greater band gap. Moreover, different masking patterns can be used between the multiple oxidation steps to achieve even further intricate patterns. Thus, in yet another embodiment of this invention, multiple masking and oxidation cycles are used to obtain multiple regions of varying band gaps.

Many applications will be made possible by having the ability to oxidize graphene layer at a particular location or with a specific pattern. These applications include graphene based 2D LEDs, high frequency transistors and solar cells. These devices will certainly take advantage of graphene's ballistic electron mobility behavior as well as its intrinsic strong and light weight properties.

Exemplary Embodiments

The following embodiments are only exemplary and illustrative in nature, and are not meant to limit the scope of the invention.

Materials and Methods

Graphene samples used in the following studies were grown by chemical vapor deposition technique on nickel coated $SiO_2$/Si substrates at 900° C. under a flow of 25 sccm methane and 1500 sccm hydrogen precursor gases. (See, Reina A, et al., *Nano Lett.* 2009,9,30-5; Brien M O and Nichols B, *Sensors Peterborough NH.* 2010, TR, 5047; and Reina A, et al., *Nano Research.* 2009,2,509-16, the disclosures of which are incorporated herein by reference.) These as-grown samples were then exposed to vacuum-pyrolysis treatment at an elevated temperature of 250° C. and a mild vacuum at 2.5 torr for 24 hours to remove the residual oxygen adsorbed during the growth process. In the following discussion, these vacuum-pyrolysis treated graphene samples are referred as pristine samples. The presence of monolayer graphene on the pristine samples was confirmed by Raman spectroscopy (Renishaw M1000) obtained with excitation energy of 2.41 eV.

Two different oxidation processes were applied to the pristine graphene samples. The first set of graphene samples were oxidized by UV/ozone treatment (Bioforce Nanosciences) at standard room temperature and pressure for 5 minutes, 30 minutes and 120 minutes. Another set of graphene samples were oxidized by remote oxygen plasma (Tepla M4L) under 20 Watts of RF power at a constant oxygen flow rate of 20 SCCM and chamber pressure of 500 mTorr for 5 seconds, 10 second, 30 seconds and 60 seconds. For brevity, in the discussion that follows, oxygen plasma treated samples are referred as O2P samples followed by the exposure time in seconds, and UV/ozone treated samples are referred as UVO samples followed by the exposure time in minutes.

Atomic-resolution images of treated graphene samples were obtained using a scanning tunneling microscope (Digital Instrument Nanoscope IIIa ECSTM) equipped with Pt/Ir scanning tip (Veeco, Inc) at constant height mode. During the imaging process, a graphene sample was placed on a flat sample stage and clamped from the top with a metal electrode that creates a direct contact with the graphene film. Tunneling I-V and differential conductance characteristics were obtained using the tunneling spectroscopy capability of the same scanning tunneling microscope. All scanning tunneling microscopy/spectroscopy (STM/STS) imaging and measurements were conducted at room pressure and temperature at a scan rate of 20.3 Hz and a stabilization voltage and current of 100 mV and 650 pA respectively. Differential conductance characteristic, dI/dV, of each sample was obtained by averaging dI/dV curves from mat least five randomly selected locations on the sample. At higher degrees of oxidation, these curves were obtained from regions that still exhibit reasonable atomic periodicity and can be imaged without excessive noise using STM. Surface chemistry characterizations were assessed using x-ray photoelectron spectroscopy (Surface Science M-Probe XPS). The XPS spectral analysis was performed using a Gaussian-Lorentzian curve-fit with Shirley baseline correction.

EXAMPLE 1

Band Gap Studies

Figure 7:
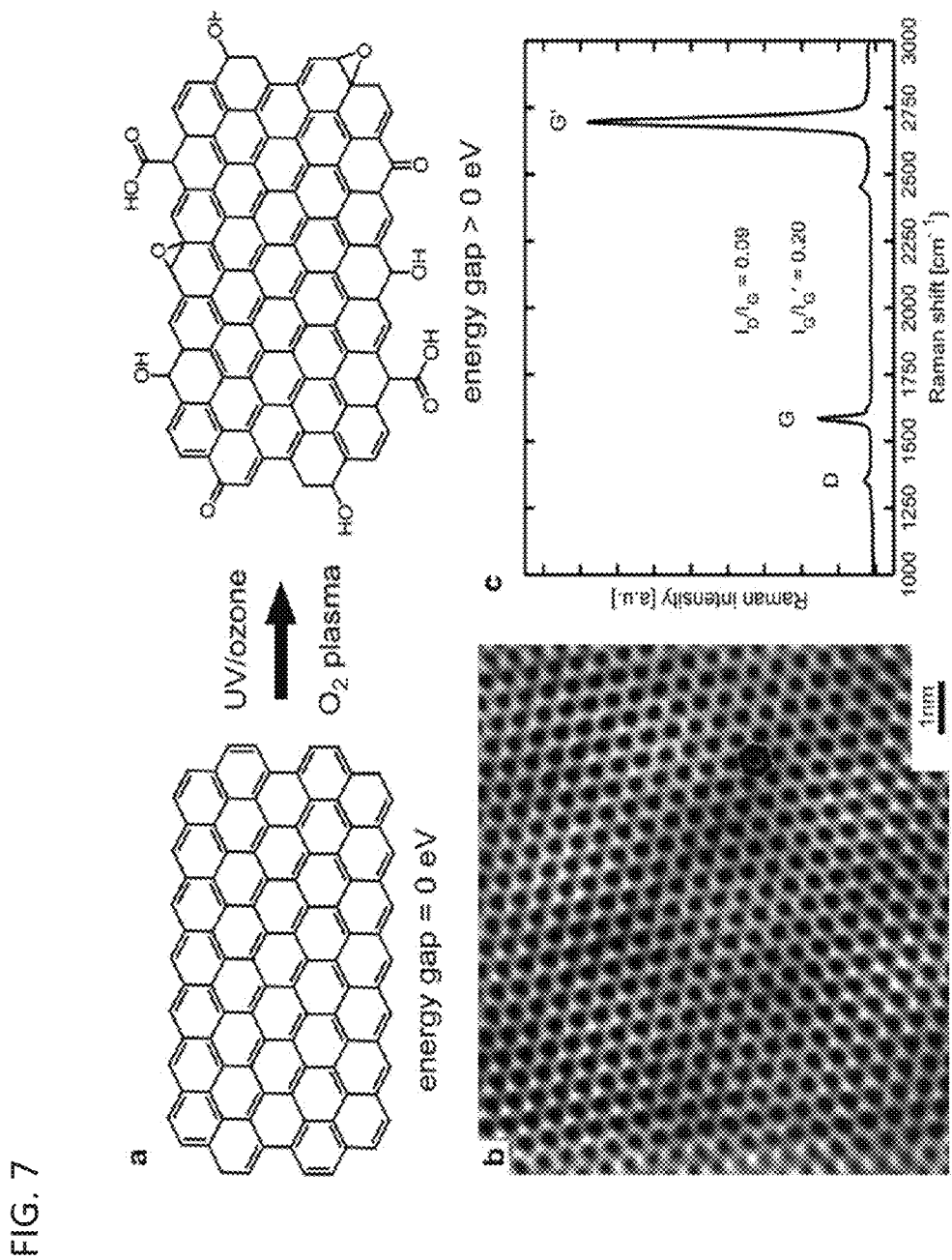
FIG. 7 provides data plots illustrating: (a) UV/ozone and oxygen plasma treatments are employed to create an energy gap opening in graphene layer, (b) Current-image of a pristine graphene layer obtained by scanning tunneling microscope (STM) showing a highly-symmetric hexagonal lattice structure, (c) Raman spectrum of a pristine graphene layer where the peak intensity ratios of ID/IG and IG/IG' are measured to be 0.09 and 0.20 respectively (A single Lorentzian profile of the G' band shows the signature of a monolayer graphene).

The atomically resolved image of pristine graphene samples obtained by scanning tunneling microscope (STM) exhibits a highly-symmetric hexagonal lattice structures, which is a typical signature of a pristine graphene layer. In agreement with previously reported study, these hexagonal lattice structures show an atomic spacing of ~0.23 nm (FIG. 7b). (See, e.g., Mizes H A, et al., *Physical Review B.* 1987,36,4491, the disclosure of which is incorporated herein by reference.) Three distinct peaks of D band (~1350 cm-1), G band (~1580 cm-1) and G' band (~2700) can be seen in the Raman spectrum of the pristine graphene samples (FIG. 7c). (See, e.g., Dresselhaus M S, et al., *Nano Lett.* 2010,10,751-8; Reina A, et al., *Nano Lett* 2009,9,30-5; and Dresselhaus M S, et al., *Annual Review of Condensed Matter Physics.* 2010,1,89-108, the disclosure of which is incorporated herein by reference.) The peak intensity ratio between the disorder-induced D band and sp2 symmetry G band, ID/IG, was measured to be 0.09. The presence of monolayer graphene can be deduced from the existence of a strong single Lorentzian profile of G' band with an intensity ratio IG/IG' of 0.20. (See, Dresselhaus M, et al., *Philosophical transactions—Royal Society Mathematical, Physical and engineering sciences.* 2008,366,231-6, the disclosure of which is incorporated herein by reference.)

As revealed by scanning tunneling spectroscopy (STS), the tunneling I-V characteristics of the oxidized graphene samples exhibit a deviation from that of the pristine graphene samples around the zero-bias region, where a sign of tunneling current flattening start to occur once the graphene is oxidized. As graphene undergoes longer duration of oxidation, this flat region becomes wider and more apparent. For example, the lightly oxidized UVO5m and O2P5s graphene show a vague flat region of 0.2 eV and 0.3 eV, while the heavily oxidized UVO120m and O2P60s graphene show a flat region as large as 1.8 eV and 2.4 eV. This large deviation of I-V characteristics of the oxidized graphene to the as-grown one suggests a strong correlation between the oxidation process and the electronic characteristics of oxidized graphene.

Figure 8:
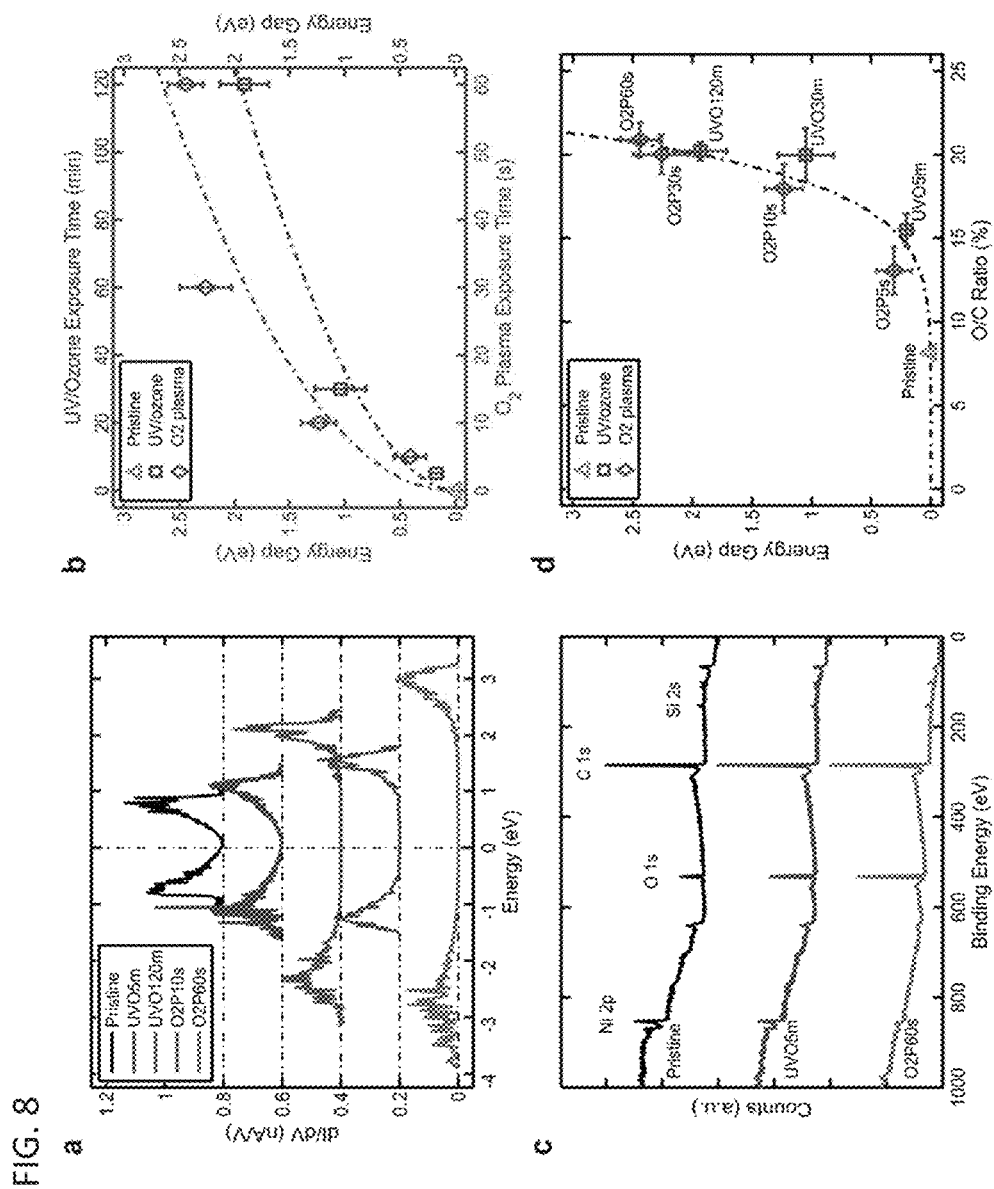
FIG. 8 provides data plots illustrating: (a) typical averaged differential conductance curves dI/dV of oxygen plasma and UV/ozone treated graphene as probed using STS at more than five random locations of the sample with stabilization voltage and current of 100 mV and 650 pA respectively, (b) Energy gap opening in graphene as a function of exposure time of oxygen plasma and UV/ozone treatments, (c) Low resolution x-ray photoelectron spectroscopy (XPS) of graphene samples at different degrees of oxidation, and (d) Energy gap opening in graphene as a function of the oxygen concentration (oxygen-to-carbon atomic ratio) of the samples (The oxygen-to-carbon atomic ratio (O/C ratio) is obtained from (c)).

The evolution of electronic characteristics of oxygenated graphene can be understood by investigating the tunneling differential conductance, which is proportional to the local density of states (LDOS), at various durations and types of oxidation process. The tunneling differential conductance presented herein was calculated numerically by taking the first derivative of the tunneling current with respect to the bias voltage (FIG. 8a). As expected, the tunneling differential conductance of the pristine graphene samples shows that their LDOS is zero at zero-energy, which confirms that their Fermi level is zero at the Dirac point. Another feature that is noticeable in the tunneling differential conductance curve is the presence of two peaks surrounding the zero-energy, which may be attributed to the constructive interference in phonon-mediated inelastic scattering. (See, Brar V W, et al., *Physical Review Letters.* 2010,104,036805; and Rutter G M, et al., *Science.* 2007,317,219-22, the disclosure of which is incorporated herein by reference.)

In contrast to that of the pristine graphene samples, the tunneling differential conduction spectra of the oxidized graphene samples shows a sign of flattening around the zero-energy region, suggesting a considerable suppression in the LDOS around the zero-energy. The mildly oxidized UVO5m graphene show a narrow flat region of about 0.2 eV around the zero-energy region. The suppression in the LDOS becomes much more pronounced as the graphene samples undergo a prolonged oxidation time. In fact, the heavily oxidized UVO120m and O2P60s graphene show extended suppression in the LDOS up to 1.8 eV and 2.4 eV (FIG. 8a). The occurrence of such energy gap in the LDOS suggests that the electronic characteristic of oxidized graphene has been transformed from zero energy gap semimetallic, into semiconducting or even insulator. (See, e.g., Leconte & Nourbakhsh, disclosed above.)

In agreement to the previous studies, the extent of the energy gap of oxidized graphene seems to depend heavily on the oxidation time, where longer exposure time to UV/ozone and oxygen plasma treatments results in larger energy gap opening. (See, Alzina, Gokus & Childres, cited above.) It is important to note that the increase of energy gap opening in oxygen plasma treated graphene is significantly faster than that in UV/ozone treated graphene. For instance, after only 60 seconds of oxygen plasma treatment, the O2P60s graphene has an energy gap of 2.44 eV. In contrast, 120 minutes of UV/ozone treatment gives the UVO120m graphene an energy gap of 1.93 eV. Such difference may be caused by different concentrations of reactive oxygen species per unit time present in both treatments. Note that in both treatments the energy gap opening does not increase linearly with the increase of oxidation time (FIG. 8b). In fact, a further opening of energy gap becomes increasingly difficult as the oxygen adsorption reaches saturation very rapidly, and defects are created on the surface that may render the graphene oxide unsuitable for use in electronic application. (Leconte, cited above.)

It can be expected that the opening of energy gap in the LDOS of oxidized graphene is induced by the introduction of disordered defects in the $sp^2$ structure of graphene due to the presence of oxygen adsorbates. These defects produce a strong disruption to the π-bond network that facilitates the electron mobility and charge transport across the graphene plane. (Elias, cited above.) Since the magnitude of such disruption depends heavily on the spatial distribution of defects sites and the degree of induced localization, an increase of defect density will certainly reduce the electron mobility. (See, Bostwick & Luo, cited above.) In addition, any alteration to the π-bond network near the defect sites further distorts the electron-phonon couplings and electron-electron interactions. (See, Luo, cited above; and Manes J L, *Physical Review B*. 2007,76,045430, the disclosure of which are incorporated herein by reference.) Therefore, the energy gap in the LDOS observed in this study can be associated with the electron mobility gap introduced by disordered defects in the π-bond network. (See, Childres, cited above.)

A more meaningful relation can be obtained by correlating the energy gap of the oxidized graphene to its oxygen-to-carbon atomic ratio (O/C ratio). Basically, the O/C ratio represents the surface concentration of oxygen adsorbates. In this study, the O/C ratio of graphene samples was obtained from the x-ray photoelectron spectroscopy (XPS) survey scans. Multiple peaks related to C 1s, O 1s, Si 2s and Ni 2p can be seen on the XPS spectra of all graphene samples (FIG. 8c). Because the intensity of photoelectron is directly proportional to the atomic density of the sample, the fractional atomic concentration of oxygen and carbon atoms can be inferred from the intensity of the O 1s and C 1s peaks. (See, Hesse R, et al, *Surface and Interface Analysis*. 2005, 37,589-607; and Peng Y and Liu H, *Industrial & Engineering Chemistry Research*. 2006,45,6483-8, the disclosures of which are incorporated herein by reference. Notice that the intensity of the O 1s peak increases as the graphene samples undergo a prolonged oxidation process. Also note that the intensity of O 1s peak of pristine graphene is not zero, which suggests that a small amount of oxygen is readily adsorbed at the graphene boundaries during the growth or storage phase and may not be easily removed.

As expected, the correlation between energy gap of an oxidized graphene and its O/C ratio is monotonic, where a higher O/C ratio yields a larger energy gap, regardless of the oxidation method used. This finding implies that the observed energy gap opening is indeed introduced by defects created by oxygen adsorbates, which create disruption in the π-bond network. These defects also induce a localization effect, where each of the oxidized site acts as a strongly repulsive hard wall barrier, and the degree of such localization is dictated by the spatial distribution and the density of the oxidized sites. (See, Luo, cited above.) In addition, the correlation confirms the existence of an O/C ratio threshold around 15%, above which the energy gap opening increases exponentially (FIG. 8d). Such threshold might be explained as a crossing from weak to strong localization regimes in graphene as localization quickly spreads over all energy spectrum at the very strong disorder regime.

In contrast to the previous studies, a slight increase in O/C ratio below this threshold does not increase the opening of energy gap dramatically. (See, Leconte & Kim, cited above.) At such regime, however, the experimental data seem to agree with the prediction done by electronic band structure calculation, where an O/C ratio of ~12% yields an energy gap opening of ~0.2 eV. (See, Nourbakhsh, cited above.) On the other hand, a slight increase in O/C ratio above this threshold results in drastic increase of energy gap opening, which is not quite in agreement with the prediction done by electronic band structure calculation. Experimental data show that an energy gap opening of ~1.5 eV can be obtained by an O/C ratio of just ~18%. Clearly, such prediction underestimates the energy gap opening because the electronic gap calculation is only valid for graphene that retains its structural integrity. At a high O/C ratio (greater than 21%), the defect density becomes extremely high such that it is unlikely that the band structure has survived. This implies that the observed opening of energy gap beyond this limit may not be a band gap, and therefore is not suitable for use in electronics applications.

EXAMPLE 2

XPS Studies

Figure 9:
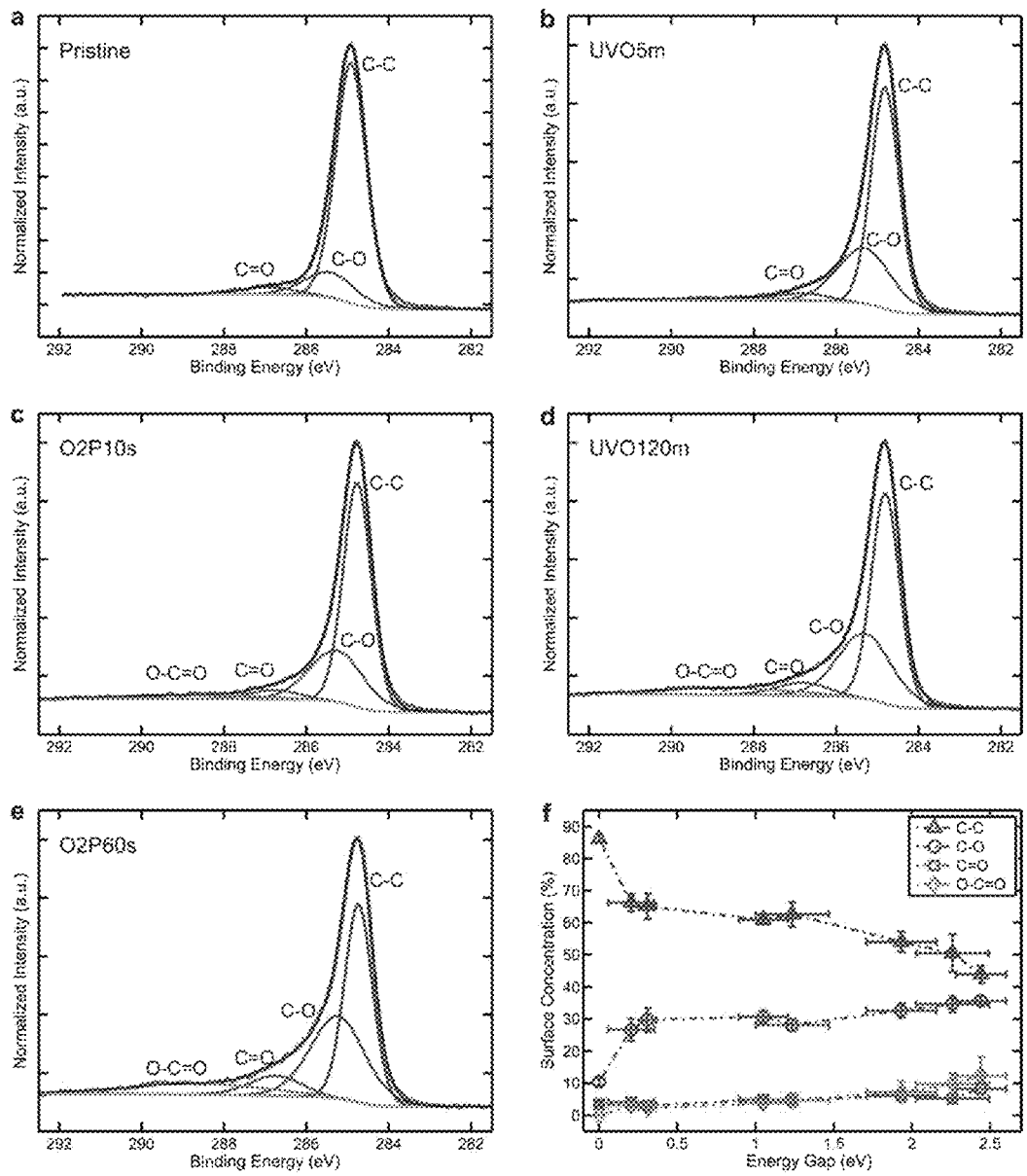
FIG. 9 provides data plots illustrating: (a) typical high resolution C 1s XPS spectra of (a) pristine, (b) UVO5m, (c) OP10s, (d) UVO120m, (e) OP60s samples, where deconvolution of these spectra using Gaussian-Lorentzian lineshape and Shirley baseline correction show the presence of C—O, C=O, and O—C=O functional groups, and (f) surface concentration of C—O, C=O, and O—C=O functional groups as a function of the energy gap in the LDOS of graphene samples.

The presence of oxygen adsorbates in the oxidized graphene samples was further investigated using high-resolution XPS scans. Curve-fitting and deconvolution of the high-resolution XPS spectra of C 1s was performed using a Gaussian-Lorentzian peak shape with Shirley baseline correction. Deconvolution of the C 1s XPS spectra of both oxygen plasma and UV/ozone treated samples shows four distinct peaks associated with sp2 C—C (284.7±0.1 eV, FWHM 0.9 eV), C—O (285.2±0.1 eV, FWHM 1.45 eV), C=O (286.7±0.1 eV, FWHM 1.45 eV), and O—C=O (288.6±0.1 eV, FWHM 4 eV). (See, Yang D, et al., *Carbon*. 2009,47,145-52, the disclosure of which is incorporated herein by reference.) The C 1s XPS spectra of the pristine graphene samples show a very strong C—O peak which may be caused by a significant presence of hydroxyl or epoxide groups at the edge. These spectra also show a relatively weak C=O peak and the absence of a peak associated with O—C=O group (FIG. 9a). The O—C=O peak can be barely seen in the C 1s XPS spectra of lightly oxidized samples, i.e. O2P5s, UVO5m, O2P10s, and O2P10s samples (FIG. 9b and FIG. 9c). A more pronounced O—C=O peak can be seen in the C 1s XPS spectra of the heavily oxidized samples, i.e. UVO120m, O2P30s, and O2P60s samples (FIG. 9d and FIG. 9e), suggesting a significant presence of carboxyl groups.

As mentioned earlier, the energy gap opening of graphene samples can be correlated to their oxygen adsorbates concentration. The pristine graphene samples are expected to have a very low surface concentration of oxygenated functional groups. On the other hand, higher surface concentration of these groups is expected to be found in graphene samples that have larger energy gap. Although the correlation is not exactly linear, the surface concentration of these groups does increase as the increase of energy gap opening of the graphene samples (FIG. 9f). The surface concentration of C—O group increases significantly from ~10% to ~35% as the energy gap increases from 0 eV to 2.4 eV. Notice that a large increase in the concentration of the C—O group is needed to initiate the energy gap opening of the graphene. Similarly, the surface concentration of C=O and O—C=O groups increases from ~3% to ~8% and ~0% to ~12% respectively for the same increase of energy gap. This finding implies that majority of oxygen adsorbates introduced by oxygen plasma or UV/ozone treatment is in the form of hydroxyl and carboxyl groups.

An oxygen uptake by the graphene layer during the oxidation process can also be observed in the O 1s and Ni2p XPS spectra of both oxygen plasma and UV/ozone treated samples. The O 1s spectra show three distinct components associated with O—C=O (531.5±0.3 eV, FWHM 1.4 eV), C=O (532.6±0.3 eV, FWHM 1.3 eV), and C—O (533.5±0.3 eV, FWHM 1.4 eV). (See, Yang, cited above.) The area percentage of each O 1s spectral component agrees with the corresponding component in the C 1s spectra. A major O 1s peak, which can be seen obviously in UVO120m and O2P60s samples, may be associated with absorbed hydroxide species or water (535.2±0.7 eV, FWHM 1.9 eV). (See, Biesinger M, et al., *Surface and Interface Analysis.* 2009, 41,324-32, the disclosure of which is incorporated herein by reference.) An additional weak O 1s peak (536.2±0.8 eV, FWHM 2.1 eV) may be associated with physisorption of oxygen. (See, Biesinger, cited above.) The main Ni metal $2p_{3/2}$ spectral component can be found at 532.5±0.5 eV with FWHM of 1 eV, while the second and third ones can be found at binding energy shifts of +3.65 eV and +6.05 eV respectively, with FWHM of 2.6 eV and 2.8 eV respectively.

EXAMPLE 3

Substrate Oxide Studies

Figure 10:
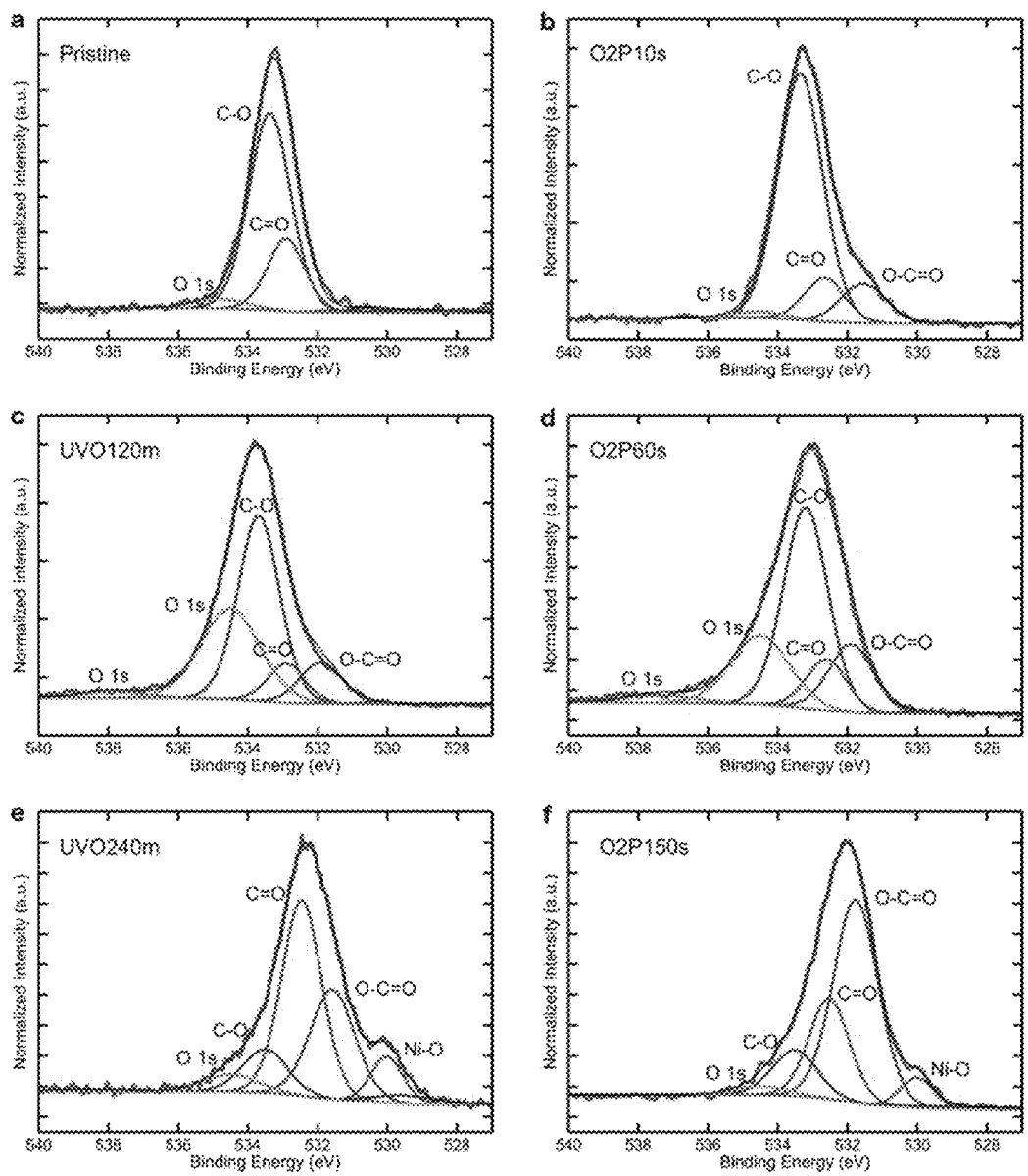
FIG. 10 provides data plots illustrating typical high resolution O 1s XPS spectra of: (a) pristine, (b) OP10s, (c) UVO120m, (d) O2P60s, (e) UVO240m, and (f) OP150s samples, where deconvolution of these spectra using Gaussian-Lorentzian lineshape and Shirley baseline correction show the presence of C—O, C=O, and O—C=O functional groups, and where the presence of a strong additional O 1s peak in (c) and (d) may be associated with physisorption of oxygen.
Figure 11:
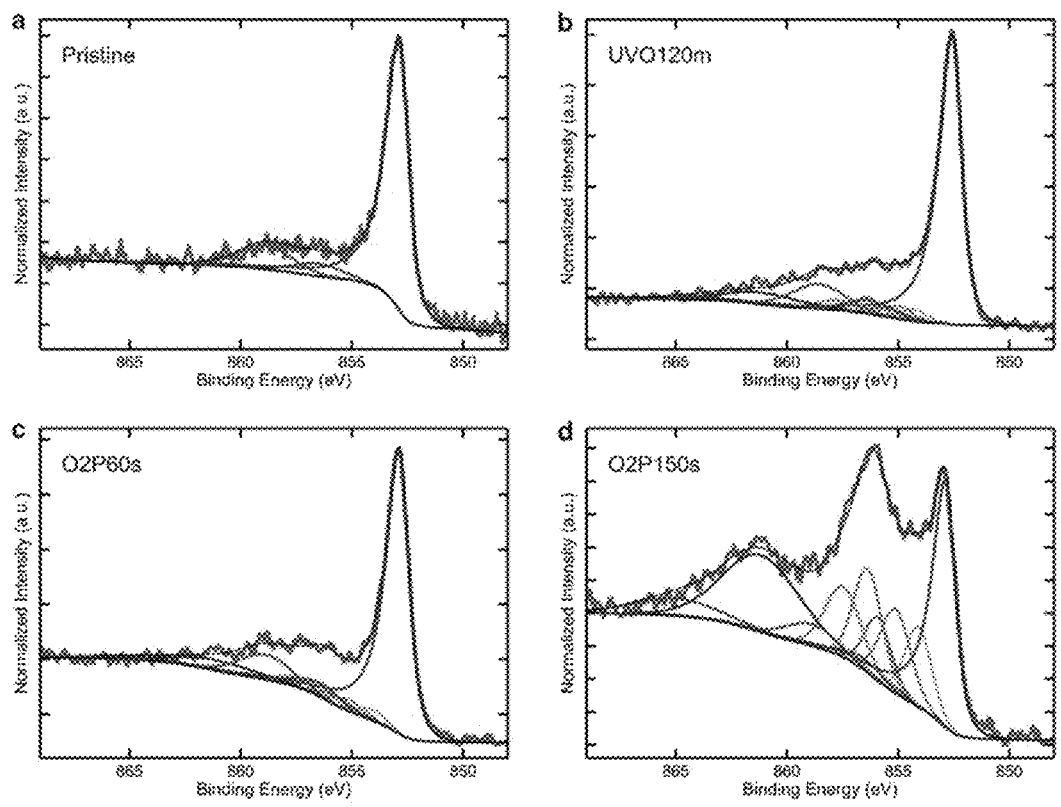
FIG. 11 provides data plots illustrating typical high resolution Ni 2p XPS spectra of: (a) pristine, (b) UVO120m, (c) O2P60s, and (d) OP150s samples, where deconvolution of these spectra using a combination of Lorentzian asymmetric and Gaussian-Lorentzian lineshape, as well as Shirley baseline correction show the presence of a metallic Ni in all graphene samples, and where the presence of a multiplet associated with $Ni(OH)_2$ can be seen in the heavily oxidized graphene samples (b) and (c).

It is important to note that the energy gap opening reported herein is not induced by the production of nickel oxide or hydroxide during the oxidation process. High-resolution O 1s XPS spectra show the non existence of peaks associated with Ni—O for all samples, even after 60 seconds of oxygen plasma and 120 minutes of UV/ozone treatments (FIG. 10a-d in the ESM). A distinct Ni—O peak can only be seen in the O 1s spectra of samples that have been oxidized even further, e.g. after being oxidized for 150 seconds in oxygen plasma or 240 minutes in UV/ozone treatments, (FIG. 10e-f in the ESM). Additional evidence provided by the Ni $2p_{3/2}$ spectra shows that the nickel catalyst layer is not oxidized, and remains in metal form in most of the samples. However, a weak presence of Ni(OH)$_2$ can be observed from the Ni$2p_{3/2}$ spectral component of the heavily oxidized samples, i.e. UVO120m, O2P30s, and O2P60s samples (FIG. 11 a-c in the ESM). A significant footprint of Ni(OH)2 can only be observed in the Ni $2p_{3/2}$ spectra of samples that have been oxidized even further, e.g. after being oxidized for 150 seconds in oxygen plasma treatment (FIG. 11d in the ESM).

It will be understood from the findings mentioned above that the oxygen uptake is indeed caused by the oxidation of graphene, as long as the samples are not over oxidized. For the heavily oxidized samples, i.e. UVO120m, O2P30s, and O2P60s samples, a small fraction of oxygen uptake is caused by the production of Ni(OH)$_2$. Such an uptake may also induce an energy gap in the LDOS, rendering the data invalid for energy gap larger than ~1.9 eV. If the energy gap data from these heavily oxidized samples are omitted, one can find an almost linear relation between the energy gap opening and the overall surface concentration of the oxygenated functional groups.

EXAMPLE 3

STM Studies

Figure 12:
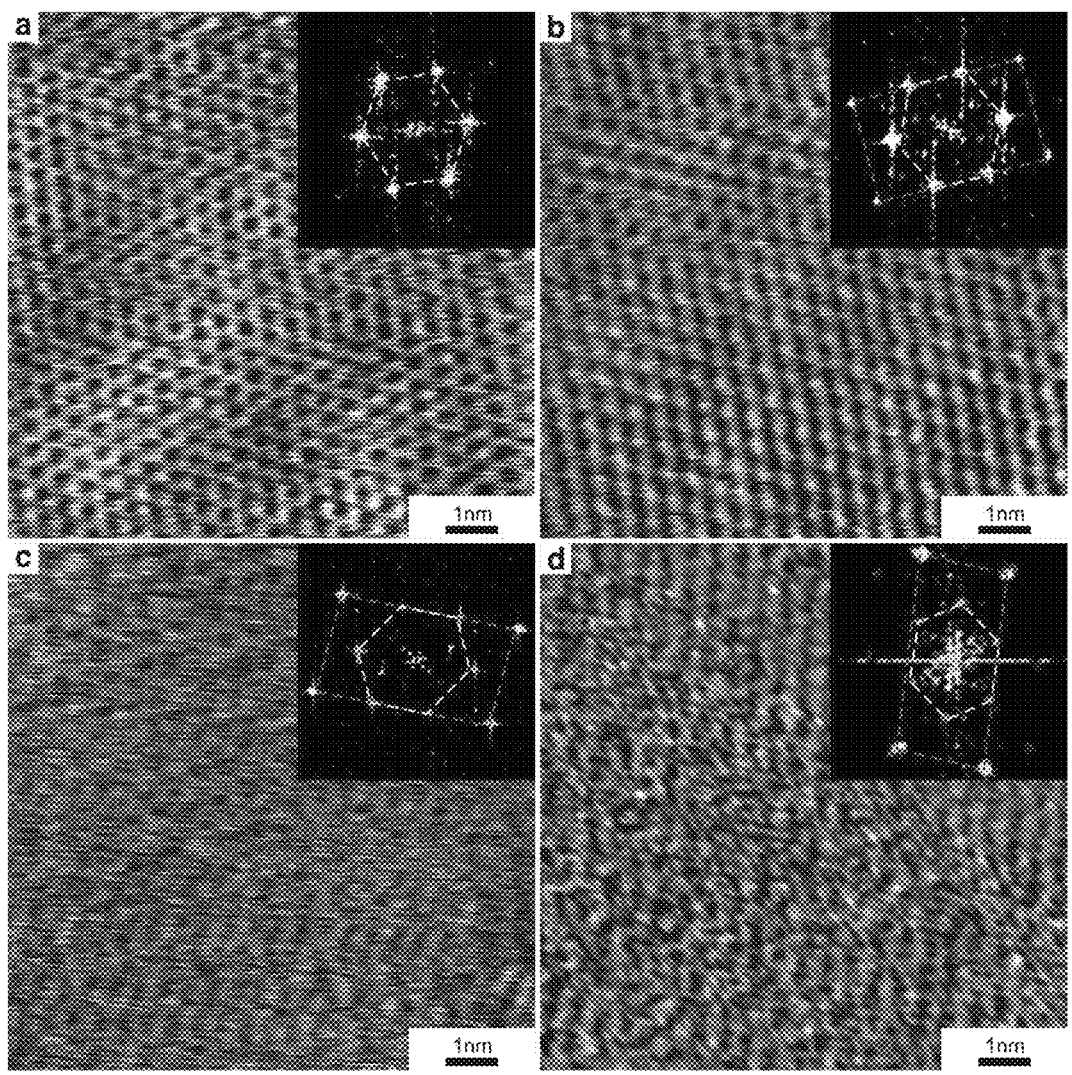
FIG. 12 shows atomically resolved STM images of (a) UVO5m, (b) O2P10s, (c) UVO120m, and (d) O2P60s for samples obtained at a scan rate of 20.3 Hz and a stabilization voltage and current of 100 mV and 650 pA respectively, where the insets show Fourier transformed unit cells

The effect of both oxygen plasma and UV/ozone treatments to the electronic structure of graphene can be literally seen from the evolution of the atomically resolved images obtained by scanning tunneling microscope (STM). As graphene is oxidized, defects on the hexagonal lattice structure due to the presence of oxygen adsorbates in the form of oxygenated functional groups start to occur. For samples with low concentration of oxygen adsorbates, i.e. O2P5s and UVO5m samples, the degree of disorder is quite low such that the hexagonal lattice structures still can be recognized from the raw STM images without using any further image processing technique (FIG. 12a). At higher concentration of oxygen adsorbates, the distortion to the lattice structure is amplified such that the hexagonal patterns become much less apparent and more difficult to be recognized from the raw STM images. Fourier transformation of the raw STM images of O2P10s and UVO30m samples reveals a superposition of a hexagonal lattice structure and a rectangular lattice structure with a size of ~0.41 nm by ~0.25 nm. Previous study suggests that this rectangular unit cell, which is independent of scan speed and azimuthal scanning direction, represents the abundance of oxygenated functional groups, in particular the hydroxyl and carboxyl groups, on the oxidized graphene. (See, e.g., Pandey D, et al., *Surface Science.* 2008,602,1607-13; and Buchsteiner A, et al., *J Phys Chem B.* 2006,110,22328-38, the disclosures of which are incorporated herein by reference.)

At even higher concentration of oxygen adsorbates, i.e. UVO120m and O2P60s samples, the defect density becomes very high, such that the hexagonal patterns cannot be recognized anymore from the raw STM images (FIG. 12c and FIG. 12d). Fourier transformation of the raw STM images of O2P60s samples shows a very faint hexagonal lattice structure superposed on a more intense rectangular lattice structure, suggesting a strong manifestation of oxygenated functional groups, in particular the hydroxyl and carboxyl groups, on its surface. (See, Pandey, cited above.) Such high surface concentration may induce extra strain to the already perturbed lattice structure which initiates lattice structure breaking. This might explain why the STM images of the highly oxidized graphene samples appear more disordered and chaotic; the concentration of carboxyl groups has increased from 0% in the pristine graphene to ~12.2% in the O2P60s samples. Judging from the existence of these functional groups, one may expect that the highly oxidized graphene samples exhibit different electronic characteristics to their pristine counterparts.

CONCLUSION

Applicant has disclosed a novel fabrication method that allows for a versatile but precise manipulation of graphene so as to develop within it an appreciable band gap while at the same time ensuring that oxidation is confined within the graphene layer. Such a graphene material can be very well-suited for a host of practical electronic applications.

The experimental findings presented herein show the effect of dry oxidation processes, in particular oxygen plasma and UV/ozone treatments, to introduce an energy gap opening in graphene. The opening of the gap itself can be correlated to the surface concentration of oxygen adsorbates, where the energy gap increases strongly as the increase of oxygen adsorbates concentration. In fact, an increase of oxygen-to-carbon atomic ratio from ~9% to ~21% is enough to increase the energy gap opening from 0 eV to ~2.4 eV. Note that a significantly observable energy gap opening occurs when the oxygen adsorbates concentration is higher than the oxygen-to-carbon atomic ratio threshold of ~15%. At high oxygen adsorbates concentration (~21%), the defect density becomes extremely high such that it is unlikely that the band structure has survived. This implies that the observed opening of energy gap may be associated with a mobility gap, not a band gap. The presence of oxygenated functional groups, e.g. C—O, C=O and O—C=O groups, induces distortion to the π-bond network of the graphene such that the hexagonal patterns become much less apparent and the rectangular unit cells become much more pronounced. In general, the oxygen plasma treatment gives a much faster rate of oxidation than the UV/ozone treatment. On the other hand, the slower oxidation rate of UV/ozone treatment may provide a better control over the degree energy gap opening.

Doctrine of Equivalents

Those skilled in the art will appreciate that the foregoing examples and descriptions of various preferred embodiments of the present invention are merely illustrative of the invention as a whole, and that variations in the fabrication methodologies of the present invention, may be made within the spirit and scope of the invention. Accordingly, the present invention is not limited to the specific embodiments described herein but, rather, is defined by the scope of the appended claims. Unless otherwise specified, all of the references disclosed herein are incorporated by reference into the specification.

What is claimed is:

1. A method of fabricating an sp2 structure graphene oxide material comprising:
   providing an sp2 structure graphene layer; and
   oxidizing at least a portion of the sp2 structure graphene layer with a dry oxidation technique for a period of time sufficient to obtain a band gap by introducing defects into the sp2 structure graphene layer, wherein an oxygen-to-carbon atomic ratio of the oxidized sp2 structure graphene layer is no greater than 21% such that the oxidation is confined to the graphene layer.

2. The method of claim 1, wherein, prior to the dry oxidation treatment, at least one portion of the sp2 structure graphene is masked to prevent oxidation in the at least one portion.

3. The method of claim 2, wherein the masking and oxidation steps are iterated to achieve a plurality of oxidized sp2 structure graphene portions, each of said portions having a desired band gap.

4. The method of claim 3, wherein each of the portions have different band gaps.

5. The method of claim 1, wherein the dry oxidation treatment is a plasma oxidation treatment.

6. The method of claim 5, wherein the plasma oxidation treatment used is a remote indirect plasma oxidation treatment.

7. The method of claim 1, wherein the dry oxidation treatment applied is a UV/Ozone oxidation treatment.

8. The method of claim 1, wherein the oxygen-to-carbon atomic ratio within the sp2 structure graphene is at least about 9%.

9. The method of claim 1, wherein the band gap is proportional to the concentration of oxidation within the sp2 structure graphene layer.

10. The method of claim 1, wherein the band gap range from 0.1 to 2.5 eV.

11. The method of claim 1, wherein the sp2 structure graphene is deposited by chemical vapor deposition.

12. The method of claim 1, wherein the sp2 structure graphene is deposited by micromechanical exfoliation.

13. A method of fabricating an sp2 structure graphene oxide material comprising:
    providing an sp2 structure graphene layer;
    masking at least one portion of the sp2 structure graphene material; and
    oxidizing at least a portion of the a sp2 structure graphene layer with a dry oxidation treatment for a period of time sufficient to obtain a band gap by introducing defects into the sp2 structure graphene layer, wherein an oxygen-to-carbon atomic ratio of the oxidized sp2 structure graphene layer is no greater than 21% such that the oxidation is confined to the sp2 structure graphene layer.

14. The method of claim 13, wherein the masking and oxidation steps are iterated to achieve a plurality of oxidized sp2 structure graphene portions, each of said portions having a desired band gap.

15. The method of claim 14, wherein each of the portions have different band gaps.

16. The method of claim 13, wherein the band gap of each of said portions is proportional to the concentration of oxidation within the sp2 structure graphene layer.

17. The method of claim 13, wherein the oxygen-to-carbon atomic ratio within the sp2 structure graphene is at least about 9%.

18. A method of fabricating an sp2 structure graphene oxide material comprising:
    providing an sp2 structure graphene layer;
    masking at least one portion of the sp2 structure graphene material;
    oxidizing at least a portion of the unmasked sp2 structure graphene layer with a dry oxidation treatment for a period of time sufficient to obtain a band gap by introducing defects into the sp2 structure graphene layer, wherein an oxygen-to-carbon atomic ratio of the oxidized sp2 structure graphene layer is no greater than 21%, such that the oxidation is confined to the sp2 structure the oxidation is confined to the graphene layer; and
    repeating and iterating the masking and oxidation to obtain a plurality of distinct sp2 structure graphene oxide layers, each having different band gaps.

19. The method of claim 18, wherein each of the portions have different band gaps.

20. The method of claim 18, wherein the band gap of each of said portions is proportional to the concentration of oxidation within the sp2 structure graphene layer.

21. The method of claim 18, wherein the oxygen-to-carbon atomic ratio within the sp2 structure graphene is at least about 9%.

* * * * *